United States Patent
Danilov et al.

(10) Patent No.: US 11,121,727 B2
(45) Date of Patent: Sep. 14, 2021

(54) ADAPTIVE DATA STORING FOR DATA STORAGE SYSTEMS EMPLOYING ERASURE CODING

(71) Applicant: EMC IP Holding Company LLC, Hopkinton, MA (US)

(72) Inventors: Mikhail Danilov, Saint Petersburg (RU); Yohannes Altaye, Dumfries, VA (US)

(73) Assignee: EMC IP HOLDING COMPANY LLC, Hopkinton, MA (US)

( * ) Notice: Subject to any disclaimer, the term of this patent is extended or adjusted under 35 U.S.C. 154(b) by 214 days.

(21) Appl. No.: 16/399,897

(22) Filed: Apr. 30, 2019

(65) Prior Publication Data

US 2020/0350928 A1 Nov. 5, 2020

(51) Int. Cl.
*H03M 13/35* (2006.01)
*H03M 13/15* (2006.01)
*H03M 13/00* (2006.01)
*G06F 11/10* (2006.01)

(52) U.S. Cl.
CPC ....... *H03M 13/353* (2013.01); *G06F 11/1076* (2013.01); *H03M 13/154* (2013.01)

(58) Field of Classification Search
CPC .............. H03M 13/353; H03M 13/154; G06F 11/1076; H04L 41/5009; H04L 67/10; H04L 41/0896; H04L 41/5025; H04L 67/22; H04L 41/0816; H04L 67/1097; H04L 43/0876; H04L 43/16; H04L 41/5096
See application file for complete search history.

(56) References Cited

U.S. PATENT DOCUMENTS

| | | |
|---|---|---|
| 5,675,802 A | 10/1997 | Mien et al. |
| 5,805,788 A | 9/1998 | Johnson |
| 5,950,225 A | 9/1999 | Kleiman |
| 6,502,243 B1 | 12/2002 | Thomas |
| 7,389,393 B1 | 6/2008 | Karr et al. |

(Continued)

OTHER PUBLICATIONS

Final Office Action received for U.S. Appl. No. 16/010,255 dated Jul. 23, 2020, 36 pages.

(Continued)

*Primary Examiner* — Justin R Knapp
(74) *Attorney, Agent, or Firm* — Amin, Turocy & Watson, LLP

(57) ABSTRACT

Adaptive data storing for a data storage system employing erasure coding is disclosed. Incoming data for storage can be encoded according to an erasure code scheme that can generate k coding fragments and m data fragments for each unit of incoming data. The portions of the encoded fragments resulting from the incoming data can be stored among different storage devices of data storage system. A first portion of the encoded fragments can be stored according to a first ratio. A storage system performance indicator based on the storing of the first portion can trigger an update of the first ratio, resulting in a second ratio that can be applied to storage of a second portion of the encoded fragments. The use of the disclosed variable k-to-m ratio can reduce instances of heavily burdened storage devices that can negatively impact performance of the data storage system.

20 Claims, 10 Drawing Sheets

(56) References Cited

U.S. PATENT DOCUMENTS

| | | |
|---|---|---|
| 7,577,091 B2 | 8/2009 | Antal et al. |
| 7,631,051 B1 | 12/2009 | Fein et al. |
| 7,664,839 B1 | 2/2010 | Karr et al. |
| 7,680,875 B1 | 3/2010 | Shopiro et al. |
| 7,721,044 B1 | 5/2010 | Chatterjee et al. |
| 8,125,406 B1 | 2/2012 | Jensen et al. |
| 8,261,033 B1 | 9/2012 | Slik et al. |
| 8,370,542 B2 | 2/2013 | Lu et al. |
| 8,479,037 B1 | 7/2013 | Chatterjee et al. |
| 8,495,465 B1 | 7/2013 | Anholt et al. |
| 8,540,625 B2 | 9/2013 | Miyoshi |
| 8,683,205 B2 | 3/2014 | Resch et al. |
| 8,751,599 B2 | 6/2014 | Tran et al. |
| 8,751,740 B1 | 6/2014 | De Forest et al. |
| 8,751,897 B2 | 6/2014 | Borthakur et al. |
| 8,799,746 B2 | 8/2014 | Baker et al. |
| 8,832,234 B1 | 9/2014 | Brooker et al. |
| 8,856,619 B1 | 10/2014 | Cypher |
| 8,856,624 B1 * | 10/2014 | Paniconi ............ H04L 1/007 714/776 |
| 8,972,478 B1 | 3/2015 | Storer et al. |
| 9,003,086 B1 | 4/2015 | Schuller et al. |
| 9,021,296 B1 | 4/2015 | Kiselev et al. |
| 9,037,825 B1 | 5/2015 | Donlan et al. |
| 9,052,942 B1 | 6/2015 | Barber et al. |
| 9,063,838 B1 | 6/2015 | Boyle et al. |
| 9,098,447 B1 | 8/2015 | Donlan et al. |
| 9,208,009 B2 | 12/2015 | Resch et al. |
| 9,218,135 B2 | 12/2015 | Miller et al. |
| 9,244,761 B2 | 1/2016 | Yekhanin et al. |
| 9,268,783 B1 | 2/2016 | Shilane et al. |
| 9,274,903 B1 | 3/2016 | Garlapati et al. |
| 9,280,430 B2 | 3/2016 | Sarfare et al. |
| 9,405,483 B1 | 8/2016 | Wei et al. |
| 9,477,682 B1 | 10/2016 | Bent et al. |
| 9,495,241 B2 * | 11/2016 | Flynn ............ G06F 11/1008 |
| 9,619,256 B1 | 4/2017 | Natanzon et al. |
| 9,641,615 B1 | 5/2017 | Robins et al. |
| 9,665,428 B2 | 5/2017 | Vairavanathan et al. |
| 9,747,057 B1 | 8/2017 | Ramani et al. |
| 9,817,713 B2 | 11/2017 | Gupta et al. |
| 9,864,527 B1 | 1/2018 | Srivastav et al. |
| 9,942,084 B1 | 4/2018 | Sorenson, III |
| 10,001,947 B1 | 6/2018 | Chatterjee et al. |
| 10,007,561 B1 * | 6/2018 | Pudipeddi ............ G06F 9/5061 |
| 10,055,145 B1 | 8/2018 | Danilov et al. |
| 10,061,668 B1 * | 8/2018 | Lazier ............ G06F 11/2094 |
| 10,108,819 B1 | 10/2018 | Donlan et al. |
| 10,127,234 B1 | 11/2018 | Krishnan et al. |
| 10,216,770 B1 | 2/2019 | Kulesza et al. |
| 10,242,022 B1 | 3/2019 | Jain et al. |
| 10,282,262 B2 | 5/2019 | Panara et al. |
| 10,289,488 B1 | 5/2019 | Danilov et al. |
| 10,331,516 B2 | 6/2019 | Danilov et al. |
| 10,361,810 B2 | 7/2019 | Myung et al. |
| 10,387,546 B1 | 8/2019 | Duran et al. |
| 10,496,330 B1 | 12/2019 | Bernat et al. |
| 10,503,611 B1 | 12/2019 | Srivastav et al. |
| 10,567,009 B2 * | 2/2020 | Yang ............ H03M 13/154 |
| 10,579,490 B2 | 3/2020 | Danilov et al. |
| 10,613,780 B1 | 4/2020 | Naeni et al. |
| 10,644,408 B2 | 5/2020 | Sakai et al. |
| 10,705,911 B2 | 7/2020 | Vishnumolakala et al. |
| 10,733,053 B1 | 8/2020 | Miller et al. |
| 10,740,183 B1 | 8/2020 | Blaum et al. |
| 10,797,863 B2 | 10/2020 | Chen et al. |
| 10,846,003 B2 | 11/2020 | Danilov et al. |
| 2002/0166026 A1 | 11/2002 | Ulrich et al. |
| 2002/0191311 A1 | 12/2002 | Ulrich et al. |
| 2005/0080982 A1 | 4/2005 | Vasilevsky et al. |
| 2005/0088318 A1 | 4/2005 | Liu et al. |
| 2005/0108775 A1 | 5/2005 | Bachar et al. |
| 2005/0140529 A1 | 6/2005 | Choi et al. |
| 2005/0234941 A1 | 10/2005 | Watanabe |
| 2006/0047896 A1 | 3/2006 | Nguyen et al. |
| 2006/0075007 A1 | 4/2006 | Anderson et al. |
| 2006/0143508 A1 | 6/2006 | Mochizuki et al. |
| 2006/0265211 A1 | 11/2006 | Canniff et al. |
| 2007/0076321 A1 | 4/2007 | Takahashi et al. |
| 2007/0239759 A1 | 10/2007 | Shen et al. |
| 2007/0250674 A1 | 10/2007 | Findberg et al. |
| 2008/0222480 A1 | 9/2008 | Huang et al. |
| 2008/0222481 A1 | 9/2008 | Huang et al. |
| 2008/0244353 A1 | 10/2008 | Dholakia et al. |
| 2008/0320061 A1 | 12/2008 | Aszmann et al. |
| 2009/0070771 A1 | 3/2009 | Yuyitung et al. |
| 2009/0113034 A1 | 4/2009 | Krishnappa et al. |
| 2009/0172464 A1 | 7/2009 | Byrne et al. |
| 2009/0183056 A1 | 7/2009 | Aston |
| 2009/0204959 A1 | 8/2009 | Anand et al. |
| 2009/0240880 A1 | 9/2009 | Kawaguchi |
| 2009/0259882 A1 | 10/2009 | Shellhamer |
| 2010/0031060 A1 | 2/2010 | Chew et al. |
| 2010/0094963 A1 * | 4/2010 | Zuckerman ........ H04L 67/1002 709/219 |
| 2010/0174968 A1 | 7/2010 | Charles et al. |
| 2010/0218037 A1 | 8/2010 | Swartz et al. |
| 2010/0293348 A1 | 11/2010 | Ye et al. |
| 2010/0332748 A1 | 12/2010 | Van der Goot et al. |
| 2011/0029836 A1 | 2/2011 | Dhuse et al. |
| 2011/0106972 A1 | 5/2011 | Grube et al. |
| 2011/0107165 A1 | 5/2011 | Resch et al. |
| 2011/0138148 A1 | 6/2011 | Friedman et al. |
| 2011/0161712 A1 | 6/2011 | Athalye et al. |
| 2011/0196833 A1 | 8/2011 | Drobychev et al. |
| 2011/0246503 A1 | 10/2011 | Bender et al. |
| 2011/0292054 A1 | 12/2011 | Boker et al. |
| 2012/0023291 A1 | 1/2012 | Zeng et al. |
| 2012/0096214 A1 | 4/2012 | Lu et al. |
| 2012/0191675 A1 | 7/2012 | Kim et al. |
| 2012/0191901 A1 | 7/2012 | Norair |
| 2012/0204077 A1 | 8/2012 | D'Abreu et al. |
| 2012/0233117 A1 | 9/2012 | Holt et al. |
| 2012/0311395 A1 | 12/2012 | Leggette et al. |
| 2012/0317234 A1 | 12/2012 | Bohrer et al. |
| 2012/0321052 A1 | 12/2012 | Morrill et al. |
| 2013/0047187 A1 | 2/2013 | Frazier et al. |
| 2013/0054822 A1 | 2/2013 | Mordani et al. |
| 2013/0067159 A1 | 3/2013 | Mehra |
| 2013/0067187 A1 | 3/2013 | Moss et al. |
| 2013/0088501 A1 | 4/2013 | Fell |
| 2013/0097470 A1 | 4/2013 | Hwang et al. |
| 2013/0145208 A1 | 6/2013 | Yen et al. |
| 2013/0238932 A1 | 9/2013 | Resch |
| 2013/0246876 A1 | 9/2013 | Manssour et al. |
| 2013/0290482 A1 | 10/2013 | Leggette |
| 2013/0305365 A1 | 11/2013 | Rubin et al. |
| 2014/0040417 A1 | 2/2014 | Galdwin et al. |
| 2014/0064048 A1 | 3/2014 | Cohen et al. |
| 2014/0115182 A1 | 4/2014 | Sabaa et al. |
| 2014/0164430 A1 | 6/2014 | Hadjieleftheriou et al. |
| 2014/0164694 A1 | 6/2014 | Storer |
| 2014/0250450 A1 | 9/2014 | Yu et al. |
| 2014/0280375 A1 | 9/2014 | Rawson et al. |
| 2014/0281804 A1 | 9/2014 | Resch |
| 2014/0297955 A1 | 10/2014 | Yamazaki et al. |
| 2014/0331100 A1 | 11/2014 | Dhuse et al. |
| 2014/0358972 A1 | 12/2014 | Guarrieri et al. |
| 2014/0359244 A1 | 12/2014 | Chambliss et al. |
| 2014/0380088 A1 | 12/2014 | Bennett et al. |
| 2014/0380125 A1 | 12/2014 | Calder et al. |
| 2014/0380126 A1 | 12/2014 | Yekhanin et al. |
| 2015/0006846 A1 | 1/2015 | Youngworth |
| 2015/0074065 A1 | 3/2015 | Christ et al. |
| 2015/0112951 A1 | 4/2015 | Narayanamurthy et al. |
| 2015/0134626 A1 | 5/2015 | Theimer et al. |
| 2015/0142863 A1 | 5/2015 | Yuen et al. |
| 2015/0178007 A1 | 6/2015 | Moisa et al. |
| 2015/0186043 A1 | 7/2015 | Kesselman et al. |
| 2015/0269025 A1 | 9/2015 | Krishnamurthy et al. |
| 2015/0303949 A1 | 10/2015 | Jafarkhani et al. |
| 2015/0331766 A1 | 11/2015 | Sarfare et al. |
| 2015/0370656 A1 | 12/2015 | Tsafrir et al. |
| 2015/0378542 A1 | 12/2015 | Saito et al. |

(56) References Cited

U.S. PATENT DOCUMENTS

| | | |
|---|---|---|
| 2016/0011935 A1 | 1/2016 | Luby |
| 2016/0011936 A1 | 1/2016 | Luby |
| 2016/0055054 A1 | 2/2016 | Patterson, III et al. |
| 2016/0162378 A1 | 6/2016 | Garlapati et al. |
| 2016/0169692 A1 | 6/2016 | Gupta |
| 2016/0170668 A1 | 6/2016 | Mehra |
| 2016/0217104 A1 | 7/2016 | Kamble et al. |
| 2016/0232055 A1 | 8/2016 | Vairavanathan et al. |
| 2016/0253400 A1 | 9/2016 | McAlister et al. |
| 2016/0277497 A1 | 9/2016 | Bannister et al. |
| 2016/0292429 A1 | 9/2016 | Bannister et al. |
| 2016/0294419 A1 | 10/2016 | Sandell et al. |
| 2016/0328295 A1 | 11/2016 | Baptist et al. |
| 2016/0357443 A1 | 12/2016 | Li et al. |
| 2016/0357649 A1 | 12/2016 | Karrotu et al. |
| 2016/0371145 A1 | 12/2016 | Akutsu et al. |
| 2016/0378624 A1 | 12/2016 | Jenkins, Jr. et al. |
| 2016/0380650 A1 | 12/2016 | Calder et al. |
| 2017/0003880 A1 | 1/2017 | Fisher et al. |
| 2017/0004044 A1 | 1/2017 | Tormasov et al. |
| 2017/0017671 A1 | 1/2017 | Baptist et al. |
| 2017/0031945 A1 | 2/2017 | Sarab et al. |
| 2017/0097875 A1 | 4/2017 | Jess et al. |
| 2017/0102993 A1 | 4/2017 | Hu et al. |
| 2017/0116088 A1 | 4/2017 | Anami et al. |
| 2017/0187398 A1 | 6/2017 | Trusov |
| 2017/0187766 A1 | 6/2017 | Zheng et al. |
| 2017/0206025 A1 | 7/2017 | Viswanathan |
| 2017/0206135 A1 | 7/2017 | Zeng |
| 2017/0212680 A1 | 7/2017 | Waghulde |
| 2017/0212845 A1 | 7/2017 | Conway |
| 2017/0235507 A1 | 8/2017 | Sinha et al. |
| 2017/0262187 A1 | 9/2017 | Manzanares et al. |
| 2017/0268900 A1 | 9/2017 | Nicolaas et al. |
| 2017/0285952 A1 | 10/2017 | Danilov et al. |
| 2017/0286009 A1 | 10/2017 | Danilov et al. |
| 2017/0286436 A1 | 10/2017 | Neporada et al. |
| 2017/0286516 A1 | 10/2017 | Horowitz et al. |
| 2017/0288701 A1 | 10/2017 | Slik et al. |
| 2017/0344285 A1 | 11/2017 | Choi et al. |
| 2018/0052744 A1 | 2/2018 | Chen et al. |
| 2018/0063213 A1 | 3/2018 | Bevilacqua-Linn et al. |
| 2018/0074881 A1 | 3/2018 | Burden |
| 2018/0121286 A1 | 5/2018 | Sipos |
| 2018/0129417 A1 | 5/2018 | Sivasubramanian et al. |
| 2018/0181324 A1 | 6/2018 | Danilov et al. |
| 2018/0181475 A1 | 6/2018 | Danilov et al. |
| 2018/0181612 A1 | 6/2018 | Danilov et al. |
| 2018/0246668 A1 | 8/2018 | Sakashita et al. |
| 2018/0267856 A1 | 9/2018 | Hayasaka et al. |
| 2018/0267985 A1 | 9/2018 | Badey et al. |
| 2018/0306600 A1 | 10/2018 | Nicolaas et al. |
| 2018/0307560 A1 | 10/2018 | Vishnumolakala et al. |
| 2018/0341662 A1 | 11/2018 | He |
| 2018/0375936 A1 | 12/2018 | Chirammal et al. |
| 2019/0028179 A1 | 1/2019 | Kalhan |
| 2019/0034084 A1 | 1/2019 | Nagarajan et al. |
| 2019/0043201 A1 | 2/2019 | Strong et al. |
| 2019/0043351 A1 | 2/2019 | Fang et al. |
| 2019/0050301 A1 | 2/2019 | Juniwal et al. |
| 2019/0065092 A1 | 2/2019 | Shah et al. |
| 2019/0065310 A1 | 2/2019 | Rozas |
| 2019/0114223 A1 | 4/2019 | Pydipaty et al. |
| 2019/0205437 A1 | 7/2019 | Larson et al. |
| 2019/0215017 A1 | 7/2019 | Danilov et al. |
| 2019/0220207 A1 | 7/2019 | Lingarajappa |
| 2019/0356416 A1 | 11/2019 | Yanovsky et al. |
| 2019/0384500 A1 | 12/2019 | Danilov et al. |
| 2019/0386683 A1 | 12/2019 | Danilov et al. |
| 2020/0026810 A1 | 1/2020 | Subramaniam et al. |
| 2020/0042178 A1 | 2/2020 | Danilov et al. |
| 2020/0050510 A1 | 2/2020 | Chien et al. |
| 2020/0104377 A1 | 4/2020 | Earnesty, Jr. et al. |
| 2020/0117556 A1 | 4/2020 | Zou et al. |

OTHER PUBLICATIONS

Office Action received for U.S. Appl. No. 16/010,246 dated Jul. 27, 2020 36 pages.

Office Action received for U.S. Appl. No. 16/177,278, dated Aug. 21, 2020, 53 pages.

Office Action received for U.S. Appl. No. 16/179,486, dated Aug. 13, 2020, 64 pages.

Guo et al., "GeoScale: Providing Geo-Elasticity in Distributed Clouds" 2016 IEEE International Conference on Cloud Engineering, 4 pages.

Guo et al., "Providing Geo-Elasticity in Geographically Distributed Clouds". ACM Transactions on Internet Technology, vol. 18, No. 3, Article 38. Apr. 2018. 27 pages.

Office Action received for U.S. Appl. No. 16/254,073, dated Aug. 18, 2020, 62 pages.

Non-Final Office Action received for U.S. Appl. No. 16/209,185 dated Jun. 18, 2020, 22 pages.

Martin Hosken, Developing a Hyper-Converged Storage Strategy for VMware vCloud Director with VMware vSAN, Jan. 2018 (Year 2018).

Non-Final Office Action received for U.S. Appl. No. 16/261,549 dated Apr. 15, 2020, 22 pages.

Non-Final Office Action received for U.S. Appl. No. 16/374,726 dated Jun. 2, 2020, 47 pages.

Matarajan, RAID 0, RAID 1, RAID 5, RAID 10 Explained with Diagrams, Aug. 10, 2010, thegeekstuff.com (18 pages).

Non-Final Office Action received for U.S. Appl. No. 16/177,285 dated Jul. 22, 2020, 31 pages.

Non-Final Office Action received for U.S. Appl. No. 16/261,547 dated Sep. 3, 2020, 26 pages.

Non-Final Office Action received for U.S. Appl. No. 16/261,548 dated Aug. 21, 2020, 42 pages.

Notice of Allowance received for U.S. Appl. No. 16/261,549 dated Jul. 17, 2020, 40 pages.

Qiang et al., "Dynamics Process of Long-running Allocation/Collection in Linear Storage Space", International Conference on Networking, Architecture, and Storage (NAS 2007), Guilin, 2007, pp. 209-216.

Non-Final Office Action received for U.S. Appl. No. 16/374,725 dated Aug. 19, 2020, 50 pages.

Non-Final Office Action received for U.S. Appl. No. 16/511,161 dated Jul. 10, 2020, 24 pages.

Notice of Allowance received for U.S. Appl. No. 15/862,547 dated Mar. 29, 2019 27 pages.

Non-Final Office Action received for U.S. Appl. No. 15/792,714 dated Apr. 4, 2019, 20 pages.

Final Office Action received for U.S. Appl. No. 15/792,714 dated Sep. 12, 2019, 43 pages.

Wikipedia "Garbage Collection", URL: https://en.wikipedia.org/wiki/Garbage_collection_(computer science) #Availability (Year: 2017) retrieved using the WayBackMachine, Sep. 8, 2017, 8 pages.

Wikipedia "Erasure code", URL: https://web.archive.org/web/20170908171158/https://en.wikipedia.org/wiki/Erasure_code (Year: 2017), retrieved using the WayBackMachine, Sep. 8, 2017, 5 pages.

Wikipedia "Front and back ends" URL: https://en.wikipedia.org/wiki/Front_and_back_ends (Year:2019), Sep. 6, 2019, 4 pages.

Notice of Allowance received for U.S. Appl. No. 15/792,714 dated Nov. 8, 2019, 31 pages.

Non-Final Office Action received for U.S. Appl. No. 15/791,390 dated Sep. 20, 2019, 27 pages.

Final Office Action received for U.S. Appl. No. 15/791,390 dated Feb. 6, 2020, 29 pages.

Non-Final Office Action received for U.S. Appl. No. 15/791,390 dated Apr. 30, 2020, 48 pages.

Huang et al., "Scale-RS: An Efficient Scaling Scheme for RS-Coded Storage Clusters," in IEEE Transactions on Parallel and Distributed Systems, vol. 26, No. 6, pp. 1704-1717, Jun. 1, 2015.

Non-Final Office Action received for U.S. Appl. No. 16/457,615 dated Jul. 20, 2020, 34 pages.

Non-Final Office Action received for U.S. Appl. No. 15/651,504 dated Mar. 21, 2019, 10 pages.

(56) References Cited

OTHER PUBLICATIONS

Non-Final Office Action received for U.S. Appl. No. 15/662,273 dated Nov. 16, 2018, 19 pages.
Final Office Action received for U.S. Appl. No. 15/662,273 dated May 15, 2019, 33 pages.
Non-Final Office Action received for U.S. Appl. No. 15/965,479 dated Apr. 15, 2019, 21 pages.
Non-Final Office Action received for U.S. Appl. No. 15/794,950 dated Jul. 9, 2019, 29 pages.
Final Office Action received for U.S. Appl. No. 15/651,504 dated Sep. 18, 2019, 15 pages.
Non-Final Office Action received for U.S. Appl. No. 15/952,179 dated Sep. 10, 2019, 42 pages.
Wikipedia, "Standard Raid Levels—RAID 6", URL: https://en.wikipedia.org/wiki/Standard_RAID_levels#RAID_6, Oct. 18, 2019, 11 pages.
Non-Final Office Action received for U.S. Appl. No. 15/656,382 dated Nov. 1, 2019, 47 pages.
Final Office Action received for U.S. Appl. No. 15/952,179 dated Nov. 26, 2019, 53 pages.
Non Final Office Action received for U.S. Appl. No. 16/024,314 dated Nov. 25, 2019, 42 pages.
Non-Final Office Action received for U.S. Appl. No. 16/177, 278 dated Dec. 2, 2019, 55 pages.
Non-Final Office Action received for U.S. Appl. No. 15/651,504 dated Dec. 31, 2019, 18 pages.
Non-Final Office Action received for U.S. Appl. No. 16/010,246 dated Dec. 5, 2019, 67 pages.
Stonebreaker et al. "Distributed RAID—A New Multiple Copy Algorithm.", IEEE ICDE, 1990, pp. 430-437.
Muralidhar et al. "f4: Facebook's Warm BLOB Storage System", USENIX. OSDI, Oct. 2014, pp. 383-398.
Final Office Action dated Feb. 12, 2020 for U.S. Appl. No. 16/024,314, 29 pages.
Non-Final Office Action received for U.S. Appl. No. 16/010,255 dated Jan. 9, 2020, 31 pages.
Office Action dated Feb. 5, 2020 for U.S. Appl. No. 16/261,551, 30 pages.
Non-Final Office Action received for U.S. Appl. No. 16/228,612 dated Feb. 27, 2020, 49 pages.
Final Office Action received for U.S. Appl. No. 16/010,246 dated Mar. 16, 2020, 33 pages.
Final Office Action received for U.S. Appl. No. 15/656,382 dated Apr. 6, 2020, 31 pages.
Non-Final Office Action received for U.S. Appl. No. 15/582,167 dated Sep. 7, 2018, 19 pages.
Non-Final Office Action received for U.S. Appl. No. 15/952,179 dated Apr. 20, 2020, 68 pages.
Notice of Allowance received for U.S. Appl. No. 16/240,193, dated May 4, 2020, 46 pages.
Final Office Action received for U.S. Appl. No. 16/177,278, dated May 11, 2020, 53 pages.
Non-Final Office Action received for U.S. Appl. No. 16/231,018 dated May 8, 2020, 78 pages.
Notice of Allowance dated May 11, 2020 for U.S. Appl. No. 16/240,193, 24 pages.
Non-Final Office Action received for U.S. Appl. No. 16/228,624 dated Jun. 24, 2020, 65 pages.
Non-Final Office Action received for U.S. Appl. No. 16/240,272 dated Jun. 29, 2020, 64 pages.
Non-Final Office Action received for U.S. Appl. No. 16/228,612 dated Jun. 29, 2020, 62 pages.
Non-Final Office Action received for U.S. Appl. No. 16/526,142 dated Oct. 15, 2020, 21 pages.
Notice of Allowance received U.S. Appl. No. 16/228,612 date Oct. 20, 2020, 84 pages.
Zhou, et al. "Fast Erasure Coding for Data Storage: A Comprehensive Study of the Acceleration Techniques" Proceedings of the 17th Usenix Conference on File and Storage Technologies (FAST '19), [https://www.usenix.org/conference/fast19/presentation/zhou], Feb. 2019, Boston, MA, USA. 14 pages.
Non-Final Office Action received for U.S. Appl. No. 16/010,255 dated Oct. 29, 2020, 65 pages.
Final Office Action received for U.S. Appl. No. 16/240,272 dated Oct. 27, 2020, 42 pages.
Non-Final Office Action received for U.S. Appl. No. 16/399,902 dated Oct. 28, 2020, 83 pages.
Notice of Allowance received for U.S. Appl. No. 16/374,726 dated Nov. 20, 2020, 78 pages.
Final Office Action received for U.S. Appl. No. 16/228,624 dated Dec. 1, 2020, 63 pages.
Non-Final Office Action received for U.S. Appl. No. 16/570,657 dated Nov. 27, 2020, 75 pages.
Final Office Action received for U.S. Appl. No. 16/177,285 dated Dec. 30, 2020, 61 pages.
Final Office Action received for U.S. Appl. No. 16/511,161 dated Dec. 30, 2020, 61 pages.
Non-Final Office Action received for U.S. Appl. No. 16/399,895 dated Jan. 4, 2021, 64 pages.
Notice of Allowance received for U.S. Appl. No. 16/374,726 dated Jan. 6, 2021, 56 pages.
Non-Final Office Action received for U.S. Appl. No. 16/670,715 dated Mar. 31, 2021, 60 pages.
Final Office Action received for U.S. Appl. No. 16/177,278 dated Feb. 24, 2021, 109 pages.
EMC; "EMC ECS (Elastic Cloud Storage) Architectural Guide v2.x;" EMC; Jun. 2015; available at: https://www.dell.com/community/s/vjauj58549/attachments/vjauj58549/solutions-ch/477 /1/h14071-ecs-architectural-guide-wp.pdf, Jun. 2015, 21 pages.
Mohan et al., "Geo-aware erasure coding for high-performance erasure-coded storage clusters", Springer Link, URL:https://link.springer.com/article/10.1007/s 12243-017-0623-2, Jan. 18, 2018.
Final Office Action received for U.S. Appl. No. 16/179,486 dated Jan. 28, 2021, 55 pages.
Non-Final Office Action received for U.S. Appl. No. 16/670,746 dated Feb. 16, 2021, 55 pages.
Dell Technologies, "ECS Overview and Architecture", h14071.18, Feb. 2021, 55 Pages.
Non-Final Office Action received for U.S. Appl. No. 16/177,285 dated Apr. 9, 2021, 41 pages.
Non-Final Office Action received for U.S. Appl. No. 16/779,208 dated Apr. 20, 2021, 71 pages.
Notice of Allowance received for U.S. Appl. No. 16/726,428 dated Jun. 14, 2021, 34 pages.
Non-Final Office Action received for U.S. Appl. No. 16/698,096 dated May 24, 2021, 62 pages.
Non-Final Office Action received for U.S. Appl. No. 16/745,855 dated May 13, 2021, 71 pages.
Non-Final Office Action received for U.S. Appl. No. 16/834,649 dated Jun. 24, 2021, 61 pages.
Non-Final Office Action received for U.S. Appl. No. 16/179,486 dated May 12, 2021, 50 pages.
Non-Final Office Action received for U.S. Appl. No. 16/570,657 dated May 12, 2021, 79 pages.
Non-Final Office Action received for U.S. Appl. No. 16/670,765 dated Jul. 20, 2021, 79 pages.
Thomasian et al., "Hierarchical RAID: Design, performance, reliability, and recovery", J. Parallel Distrib. Comput. vol. 72 (2012) pp. 1753-1769.

\* cited by examiner

ADAPTIVE DATA STORING FOR DATA STORAGE SYSTEMS EMPLOYING ERASURE CODING

TECHNICAL FIELD

The disclosed subject matter relates to data storage, more particularly, to adapting storing of data to mitigate input/output stress in a data storage system employing erasure coding.

BACKGROUND

Conventional data storage techniques can store data in one or more arrays of data storage devices. As an example, data can be stored in an ECS (formerly known as ELASTIC CLOUD STORAGE) system, hereinafter ECS system, such as is provided by DELL EMC. The example ECS system can comprise data storage devices, e.g., disks, etc., arranged in nodes, wherein nodes can be comprised in an ECS cluster. One use of data storage is in bulk data storage. Data can conventionally be stored in a group of nodes format for a given cluster, for example, in a conventional ECS system, all disks of nodes comprising the group of nodes are considered part of the group. As an example, a storage group of five nodes, with ten disks per node, at 8 terabytes (TBs) per disk is roughly 400 TB in size. Data can be stored in a given cluster in various schema. One data storage scheme can comprise erasure coding. Erasure coding can generate m coding segments based on k data segments of a portion of data, e.g., a data chunk can comprise k data segments that can be protected by m generated coding segments. Erasure coding can protect against the loss of up to m segments of the k+m segments corresponding to the portion of data to be stored.

DETAILED DESCRIPTION

Figure 1:
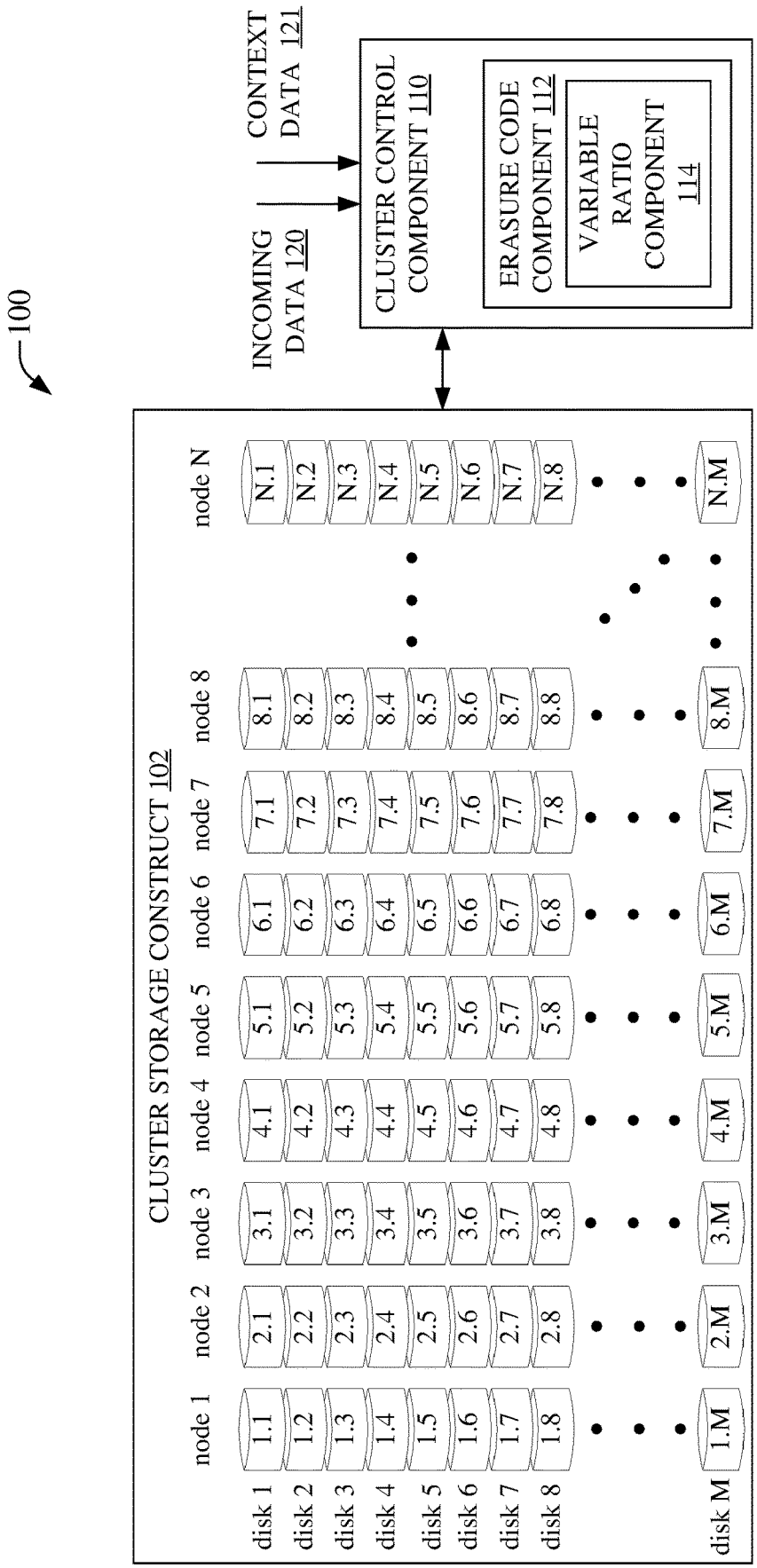
FIG. 1 is an illustration of an example system that can facilitate adaptive data storing in cluster data storage systems employing erasure coding, in accordance with aspects of the subject disclosure.

The subject disclosure is now described with reference to the drawings, wherein like reference numerals are used to refer to like elements throughout. In the following description, for purposes of explanation, numerous specific details are set forth in order to provide a thorough understanding of the subject disclosure. It may be evident, however, that the subject disclosure may be practiced without these specific details. In other instances, well-known structures and devices are shown in block diagram form in order to facilitate describing the subject disclosure.

As mentioned, data storage techniques can conventionally store data in one or more arrays of data storage devices, hereinafter a cluster, real cluster, cluster storage construct, etc. As an example, data can be stored in an ECS system such as is provided by DELL EMC. The example ECS system can comprise data storage devices, e.g., disks, etc., arranged in nodes, wherein nodes can be comprised in an ECS cluster. One use of data storage is in bulk data storage. Data can conventionally be stored in a group of nodes format for a given cluster, for example, in a conventional ECS system, all disks of nodes comprising the group of nodes are considered part of the group. As such, a cluster having many nodes, each with many disks, can, in some conventional embodiments, comprise a large amount of data storage space.

Data can be stored in a cluster according to one or more erasure coding schema to provide protection against data loss, e.g., for a portion of data, such as a data chunk, etc., that can be divided into k data segments, m coding segments can be generated such that up to m segments of the k+m data/coding segments can be lost without compromising access to the data of the data portion, e.g., the data chunk can be resilient to the loss of up to m data/coding segments.

Figure 10:
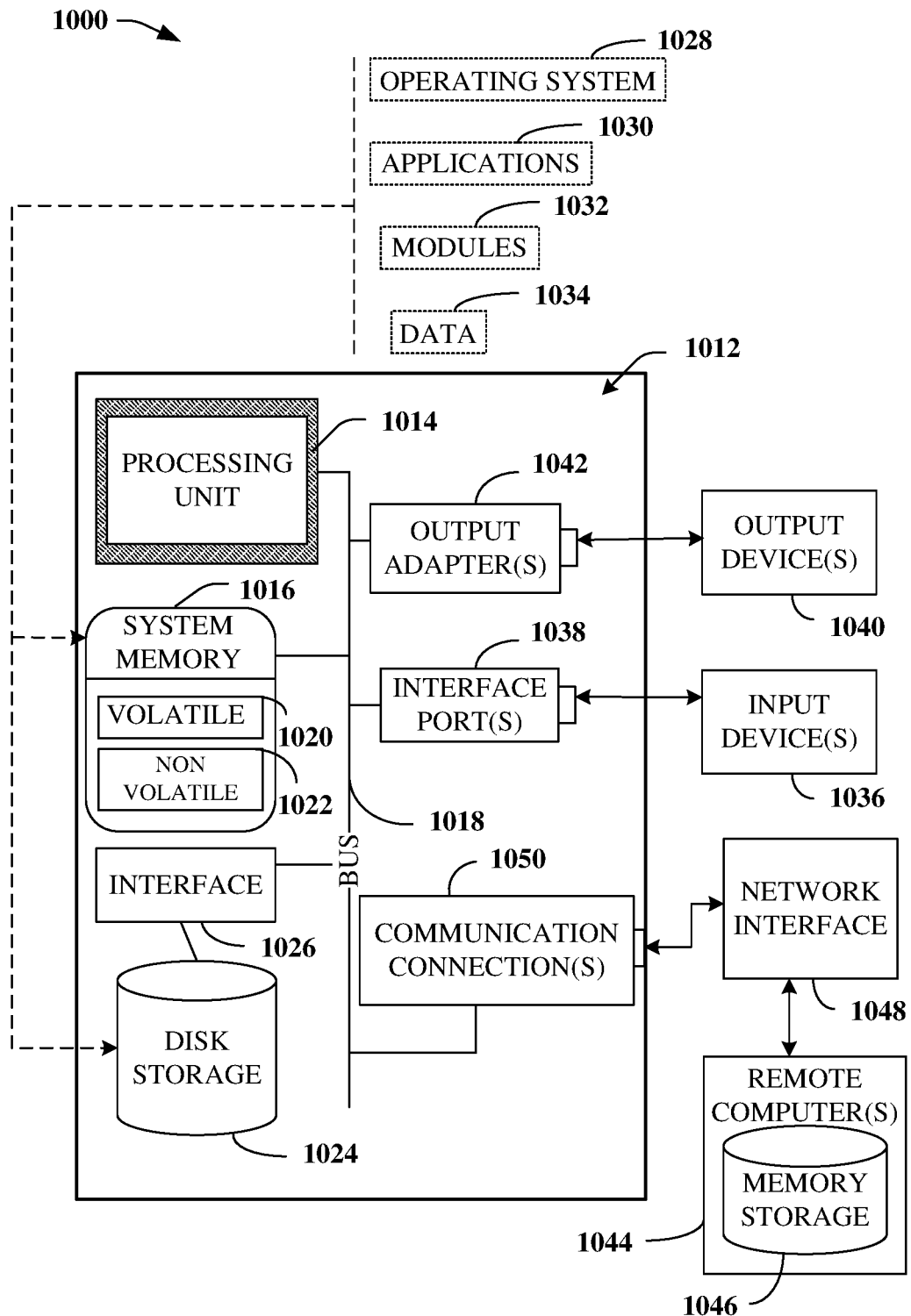
FIG. 10 illustrates an example block diagram of a computing system operable to execute the disclosed systems and methods in accordance with an embodiment.

Whereas a real cluster(s) can comprise real nodes, and the real nodes can comprise real data storage devices, e.g., real disks, real nodes can comprise computing resources, e.g., a processor(s), memory(ies), network interface(s), user interface(s), etc., such as is illustrated at FIG. 10, etc. The real node can be a discrete hardware node that comprises real storage devices, for example a real node can be a rack mounted controller interacting with M hard disks, for example in a rack that can be separate from another real node that can comprise a second rank mounted controller and other real storage devices. In an embodiment, a real node can execute operations related to control of the real node, for example, managing data storage space provided by the example M hard disks, etc. Further, in some embodiments, a real node can execute an instance of a mapped cluster storage service that can enable the virtualization of real storage space into mapped clusters that can span real nodes of a real cluster(s), e.g., interaction between mapped cluster storage service instances executing on different real node computing resources can enable data interaction via a mapped cluster comprising mapped nodes comprising mapped disks.

In general, modern storage systems, e.g., ECS, etc., often function with immutable data portions, e.g., chunks, etc. In such systems, updates to data represented in a chunk are actually stored to a new location rather than modifying the already written chunk, e.g., the original data portion remains unchanged. As such, 'modification' of data in a first chunk actually occurs by using some of the data in the first chunk and some modifying data written in a second chunk, wherein the modifying data is in lieu of data that would have been modified in the first chunk. Furthermore, generally, modern storage systems use capacity load balancing techniques to adapt distribution of data among nodes/disks. One effect from using capacity load balancing can be that new nodes/disks can receive more, sometimes significantly more, write operations than older nodes/disks, e.g., legacy nodes/disks that were part of the storage system prior to addition of the new nodes/disks. As such, it can be noted that capacity load balancing can result in poor input/output (I/O) load balancing, e.g., new nodes/disks can experience disproportionate reads, writes, etc., as a result of trying to balance capacity by filling the more empty new nodes/disks before further filling legacy nodes/disks. Significant I/O imbalance across storage units can result in hot spots that can slow down the system, slow down access to data, result in errors, etc. As an example, disks that are overwhelmed with I/O requests significantly impact ECS performance characteristics. The term 'hot' can be used to indicate a node/disk that can experience more I/O operations than a 'normal' node/disk, which can experience more I/O operations than a 'cool' node/disk. As such, temperature analogies can indicate a relative level of I/O operations experienced by a node/disk.

Generally, there can be various causes of a significant I/O imbalance, e.g., a specific data access pattern, expansion of a storage system, storage unit replacement, specific features of capacity load balancing, just plain bad luck, etc., and combinations of these factors. In an aspect, I/O load balancing can be remedied reactively, e.g., after determining an overheated node/disk, a system, for example, can try to redistribute data to spread the I/O operations to other nodes/disks, etc. However, reactive remedies can, in some instances, actually cause worse I/O load balancing issues, e.g., reads/writes needed to move data to other nodes/disks can actually result in additional I/O load on an already hot node/disk, e.g., you can't move hot data without reading it from the hot disk, etc. Accordingly, there can be a need for a more proactive technology for I/O load balancing in cluster storage systems.

It is noted that, generally, a modern cluster-based storage system can store data via protection sets, for example, protection sets caused by employing erasure code technology wherein each protection set can be a union of related data fragments and coding fragments, e.g., data segments and coding segments. Moreover, the immutability of data portions, e.g., chunks, that can be used in modern storage systems results in data fragments and coding fragments remaining static, e.g., each data/coding fragment is just created and stored to a disk once and, in this aspect, data and coding fragments can be regarded as equivalent fragments written to a node/disk. Further, data and coding fragments typically have the same probability of being lost, corrupted, etc., therefore, data and coding fragments can be recovered, e.g., via decoding according to a relevant erasure coding scheme, also with the same, or similar, probabilities. Additionally, data and coding fragments, in the event of a recovery operation for lost/corrupt fragments from a protection set, also have the same/similar probability to be read from disks to be used in the recovery operation. Again, in this aspect, data and coding fragments can again be viewed as generally equal fragments written to a disk.

However, data and coding fragments are not typically equal from the perspective of reads. In a client data access event, only data fragments are read, e.g., coding fragments are not read in a client data access event. Accordingly, data fragments can be hotter than coding fragments and, in case of already hot data within a protection set, the data fragments can be significantly hotter than coding fragments, e.g., data fragments can be accessed more often than coding fragments for client data access events, but when some particular data is access more frequently than other data, this can compound the I/O problem. In regard to other system process, data and coding fragments again may be not be regarded as equal, for example, in a replication process, a system can read recently created data from a disk to replicate it, however, typically only data fragments are replicated and erasure coding is then applied to the replicated data fragments to generate new coding fragments, illustrating that again data fragments can be hotter than coding fragments.

The above observations indicate that, typically, data fragments can be hotter than coding fragments in normal steady state operation of a data storage system employing erasure coding. This observation, when ignored, can result in noteworthy I/O imbalances. However, on the other hand, this observation can motivate a more proactive I/O load balancing technology. A cluster based storage system employing erasure coding can, in a steady state, e.g., not adding new nodes/disk, etc., generally write data to disks in a manner that results in a ratio of data fragments and coding fragments that is uniform across the disks of a node, hereinafter a 'KMR,' 'km ratio', or similar term. In an aspect, the KMR can depend on the erasure coding protection scheme being employed. As an example, a 10+2 erasure code scheme can result in a 10:2 ratio of data fragments to coding fragments, e.g., a 10:2 KMR where a disk can have 2 coding fragments for every 10 data fragments. In an aspect, each node that can drive creation of new data within a cluster can independently write data in a manner that keeps the KMR. As such, with a proper capacity load balancing mechanism, a healthy ratio of data and coding fragments at the cluster level can result.

In contrast to the steady state operation of the cluster storage system, upon capacity addition, e.g., scaling-up by adding new disks to existing nodes, scaling-out by adding new nodes with new disks to a cluster, etc., the previously observed phenomenon can become problematic in that the new nodes/disks can become overheated. Accordingly, the presently disclosed subject matter can violate the KMR to adapt the temperature of the system's nodes/disks. Typically, a capacity load balancer strives to fill new/empty disks more quickly that other legacy disks, which normally contain some amount of data already, in order to 'balance capacity' among the disks of the cluster storage system. As previously is noted, these new disks can experience greater read requests, e.g., from system processes like replication that can read recently created data, from the observation that newer data is often hotter that older data, etc. This can result in new disks becoming hotspots that can affect cluster storage system performance.

In an embodiment, the KMR can be violated when a cluster storage system is scaled-out, scaled-up, etc., e.g., new disks can be used to store more fragments with a greater ratio of coding fragments to data fragments than the KMR to cool the new disk, with a lower ratio of coding to data fragments than the KMR to warm the new disk, etc. As such, when capacity is allocated for another protection set to be written into a cluster data storage system, a part of the capacity blocks may belong to legacy disks, a part of the capacity blocks may belong to new disks, and the KMR can be violated to provide heating and cooling of disks of the cluster data storage system. By increasing the number of coding fragments written to a disk, the disk can be cooled to forestall I/O operation problems in a proactive manner. The data fragments corresponding to the coding fragments being written to the new disk can be written to legacy disks to warm those legacy disks, thereby balancing the I/O loading among the disks, new and legacy, of the cluster data storage system. In some embodiments, only coding fragments are written to new disks while corresponding data fragments are written to legacy disks. In some embodiments, some coding fragments and some data fragments are written to new disks and remaining data fragments are written to legacy disks. In some embodiments, some coding fragments and some data fragments are written to new disks and some remaining data fragments and some remaining code fragments are written to legacy disks. In some embodiments, coding fragments and corresponding data fragments are written to new disks. In an aspect, nearly any combination of coding fragments and corresponding data fragments can be written among a new disk and legacy disks without departing from the scope of the instant disclosure, even where not explicitly recited for the sake of clarity and brevity.

Over time, where the KMR is intentionally violated to proactively avoid an I/O bottleneck, the proportion of coding fragments on a new disk can be greater than would have been written with KMR. At some time, the new disk can be heated up by starting to write more data fragments into it, thereby reducing the on-disk ratio of coding to data fragments. Eventually, the new disk can be warmed to a sufficient level that it acts as a legacy disk, e.g., incoming chunks are written with KMR to the 'new disk'. In some embodiments, the 'new disk' can be intentionally heated up (again intentionally violating the KMR) to more quickly bring the ratio of stored coding fragments and stored data fragments on the 'new disk' into accord with KMR. When the 'new disk' takes on a legacy disk character, the cluster data storage system can be said to again be in a steady state where KMR is followed for incoming chunks. In some embodiments, a trigger can be implemented to convert a new disk to a legacy disk, for example, a system can convert a new disk to a legacy disk when the new disk contains is a threshold level of data stored to an average legacy disk, has been in service a threshold amount of time, exhibits a transition across a threshold level of I/O operations, etc. As an example, if a new disk has a large amount of cold data written to it, e.g., the data is hardly ever read by a client, then the disk can be determined to not be excessively hot or cold even if the incoming cold data is written to the new disk in accord with KMR, as such, violating KMR can be avoided where other factors result in storage without an I/O bottleneck. As another example, hot data can be written to a new disk in accord with KMR where the I/O hardware is sufficient to manage the hot disk, e.g., if the I/O hardware can manage 100 operations per unit time and writing the data at KMR results in only 25 operations per unit time, then writing with KMR can be determined to be acceptable.

In some embodiments, the deviation from KMR can be termed 'variable KMR' (VKMR). In an aspect, VKMR can be adjusted in real time or near real time. In an embodiment, when a cluster data storage system is scaled-up, scaled-out, etc., VKMR can be instituted with writing coding fragments for incoming data to the new disk and data fragments for the incoming data to legacy disks, resulting in the new disk being a cold disk. Continuing the example, VKMR can then be incrementally adjusted based, for example in measured I/O events for the new disk, storage space, etc., wherein the incremental adjustment slightly warms the new disk. The example VKMR can then continue to be adjusted until a threshold value is reached, e.g., the new disk is warm but not hot, etc., and incoming data can be written accordingly. Of note, in this example, where the threshold value is traversed, e.g., a client starts reading data from the new disk in high volumes, etc., then the VKMR can be adjusted to cool the new disk. Similarly, if the VKMR results in a disk that is too cool, then the VKMR can be adjusted to further hear the new disk. Additionally, in some embodiments, the adjustment of the VKMR can comprise heuristics, much like a thermostat in a house, which can keep the I/O events within a selectable value range, etc., e.g., the VKMR can be adapted at a first threshold value and then readapted at a second threshold value that can be different from the first threshold value. Moreover, in these examples, the VKMR can be adapted at different rates, e.g., the hotter a disk gets, the more the VKMR can be adjusted to cool the disk, etc. Further, The VKMR can comprise a delay, averaging, etc., that can damp the adjusting of the VKMR to avoid reacting to transient spikes in I/O operations, for example, a short burst of client data reads may not trigger an adjustment of the VKMR where it is correspondingly damped, however, where the client reads continue sufficiently, the VKMR can then be adjusted to proactively cool the disk.

To the accomplishment of the foregoing and related ends, the disclosed subject matter, then, comprises one or more of the features hereinafter more fully described. The following description and the annexed drawings set forth in detail certain illustrative aspects of the subject matter. However, these aspects are indicative of but a few of the various ways in which the principles of the subject matter can be employed. Other aspects, advantages, and novel features of the disclosed subject matter will become apparent from the following detailed description when considered in conjunction with the provided drawings.

FIG. 1 is an illustration of a system 100, which can facilitate adaptive data storing in cluster data storage systems employing erasure coding, in accordance with aspects of the subject disclosure. System 100 can comprise a cluster storage construct 102, which can be embodied in a cluster storage system. In an embodiment, cluster storage construct 102 can be embodied in a real cluster storage system comprising one or more hardware nodes that each comprise one or more storage devices, e.g., hard disks, optical storage, solid state storage, etc. Cluster storage construct 102 can receive data for storage in a cluster, e.g., a redundant array of independent nodes (RAIN), for example, nodes 1-N, each comprising up to M disks, e.g., disks 1-M. In an embodiment, the RAIN can be N×M in size. In some embodiments, the RAIN can be N nodes, wherein each node comprises up to M disks, e.g., Node 1 can comprise M disks, Node 2 can comprise M' disks, Node 3 can comprise M" disks, etc., wherein M, M', M", etc., can be the same or different numbers of disks. As an example, Node 1 can comprise eight disks, Node 2 can comprise eight disks, Node 3 can comprise four disks, . . . , Node N can comprise nine disks, etc.

Data, e.g., incoming data 120, etc., can be stored by portions of the one or more storage devices, e.g., disks, etc., of cluster storage construct 102. In some embodiments, data can be written as chunks of data, hereinafter 'data chunk', 'chunk', etc., that, for example, can be 128 MB in size. The chunks, in some embodiments, can be immutable, e.g., once written they are not intended to be modified, rather, modifications to data are written into new chunks and, eventually when the older chunk does not comprise relevant data, it can be subject to garbage collection techniques outside the scope of this disclosure. In some embodiments, data can be replicated to provide data protection, e.g., copies of chunks can be made at other disks, nodes, clusters, etc. In some embodiments, replication can be combined with convolution technology to improve storage, for example by consuming less storage space, etc. In some embodiments, erasure coding technology can be employed to improve storage, e.g., coding fragments, also referred to as coding segments, etc., resulting from erasure coding of a chunk can be used to protect data fragments, also called data segments, etc., of the chunk. In an aspect, coding segments and data segments can be stored on the same or different disks, nodes, clusters, etc. As an example, data segments of a first chunk can be stored at a first portion of a disk and corresponding coding segments can be written at a next portion of the disk. As another example, data segments of a first chunk can be stored at a first portion of a disk and corresponding coding segments can be written at a second portion of the disk that is not adjacent to the first portion of the disk. As further example, data segments of a first chunk can be stored at a first portion of a first disk and corresponding coding segments can be written at a second portion of a second disk. As yet another example, data segments of a first chunk can be stored at a first portion of a first disk of a first node and corresponding coding segments can be written at a second portion of a second disk of a second node. Numerous other examples are readily appreciated and are all considered within the scope of the subject disclosure even where not recited for the sake of clarity and brevity.

In an aspect, erasure coding can generate m coding fragments for k data fragments. As an example, in a 10+2 erasure coding scheme m=2 and k=10. As a second example, in a 12+4 erasure coding scheme m=4 and k=12. Generally, when a cluster data storage system is operating in a nominal state, incoming data can be encoded according to one or more erasure coding schema and then be written to the disks of the cluster with a typically constant ratio of k:m. The ratio of k:m can be referred to as a KM-ratio (KMR). In an aspect, KMRs can be the same across nodes of a cluster, e.g., all nodes can store encoded data with the same KMR, for example, where a 10+2 erasure coding scheme is used by a cluster, all nodes can store encoded data at a ratio of 10 data fragments per 2 coding fragments on the disks of each node in the cluster. However, in another aspect, KMRs can be the different among nodes of a cluster, e.g., each node can employ a selected reassure coding scheme that can be different than another erasure coding scheme of another node, which can result in correspondingly different KMRs. As an example, a first node can employ a 10+2 erasure coding scheme, a second node can employ a 12+4 erasure coding scheme, whereby the first node can store encoded data at a ratio of 10 data fragments per 2 coding fragments on the disks of the first node, and the second node can store encoded data at a ratio of 12 data fragments per 4 coding fragments on the disks of the second node.

System 100 can comprise cluster control component 110 that can facilitate operation of cluster storage construct 102. In some embodiments, cluster control component 110 can be comprised local to a cluster of real nodes, for example, as a controller in a data center that comprises the nodes/disks of a cluster, e.g., 230, etc. In some embodiments, cluster control component 110 can be located remote from the cluster, for example, as a controller in a first location communicating with nodes at other locations via a communication framework, e.g., 330, etc. Cluster control component 110 can comprise erasure code component 112 that can orchestrate erasure coding of incoming data 120 for storage on disks of nodes of cluster storage construct 102. Erasure code component 112 can comprise variable ratio component 114 that can determine one or more VKMRs that can be the same or different as a KMR associated with an erasure coding scheme employed in nominal operation of the cluster. VKMRs can alter a 'temperature' of a disk by altering a ratio at which coding fragments and/or data fragments are stored on a disk of a node of the cluster. In an aspect, where data fragments are generally hotter than coding fragments, applying a higher VKMR, e.g., one having more coding fragments for a given number of data fragments than a corresponding KMR, to storing of incoming data 120 can act to cool a disk, while applying a lower KMR, e.g., fewer coding fragments for a given number of data fragments than KMR, can act to warm a disk. The VKMR can also be higher where for a given number of coding fragments there are fewer data fragments than a corresponding KMR, and lower where for a given number of coding fragments there are more data fragments than a corresponding KMR.

In an aspect, variable ratio component 114 can employ context data 121 in determining one or more VKMR, adjusting a VKMR, etc. Context data 121 can indicate information relevant to adapting the storage of incoming data 120 from KMR to another ratio, e.g., to avoid creating hot disk, avoid creating a cold disk, etc. In an embodiment, context data 121 can comprise I/O event information, e.g., a count of read events of data stored at a disk of the cluster, etc. Where the I/O event information, for example, indicates an unusually high number of I/O events at a disk, a VKMR can be determined and employed to increase the ratio of coding segments relative to data segments being written to the disk. Where data segments are generally hotter than coding segments, this can proactively prevent the disk from getting hotter. Where, in the example, the number of I/O events decreases, the VKMR can be adjusted to, for example, reduce the cooling effect on the disk by allowing more data fragments per unit cooling fragments to be written to that disk. In an aspect, variable ratio component 114 can be analogous to a thermostat and can adjust future heating and cooling of a disk based on selectable values.

Figure 2:
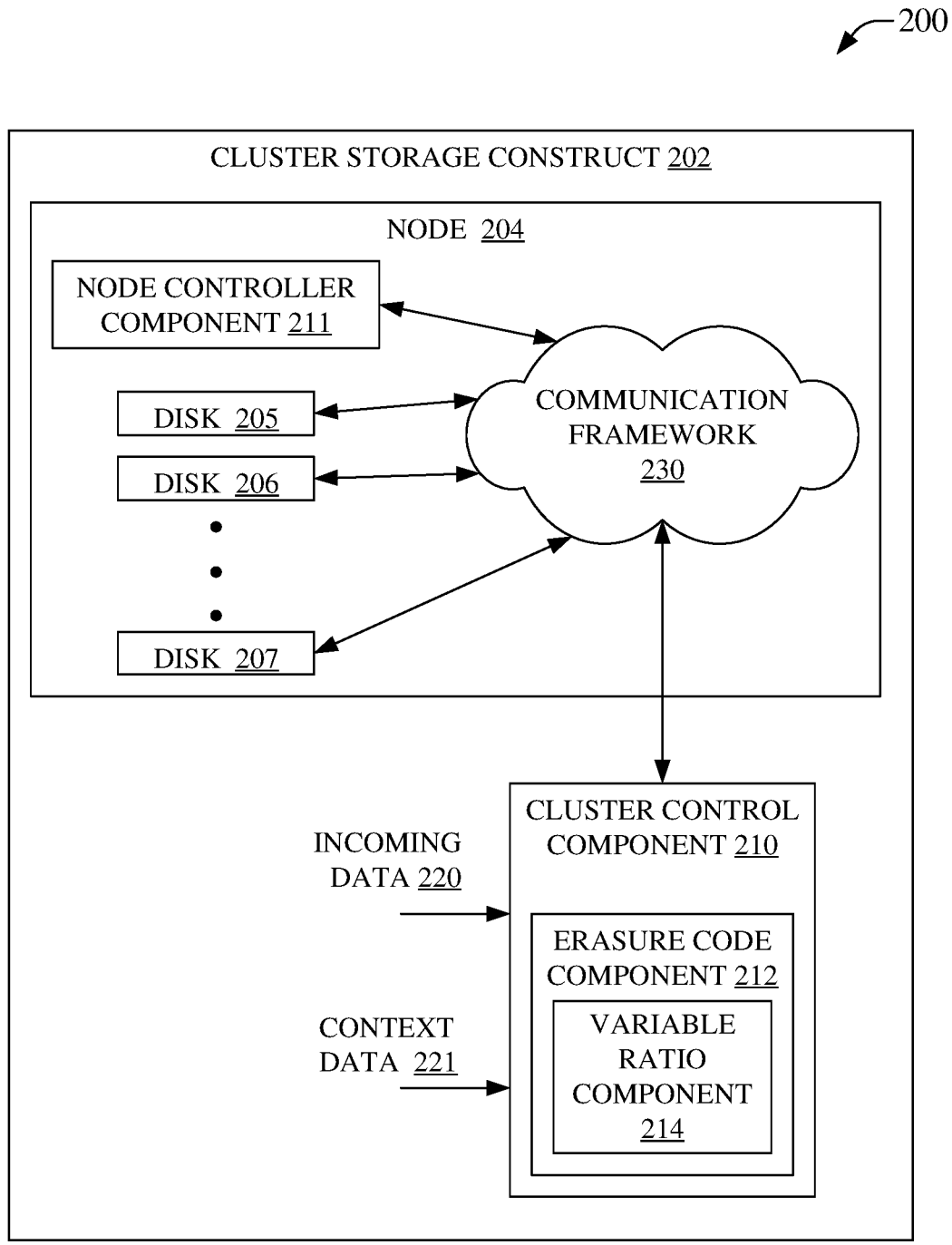
FIG. 2 is an illustration of an example system that can facilitate adaptive data storing in response to scaling-up a cluster data storage systems employing erasure coding, in accordance with aspects of the subject disclosure.

FIG. 2 is an illustration of a system 200, which can enable adaptive data storing in response to scaling-up a cluster data storage systems employing erasure coding, in accordance with aspects of the subject disclosure. System 200 can comprise cluster storage construct 202 that can comprise node 204. Node 204 can comprise node controller component 211 and disks 205-207, etc. In an aspect, system 200 can comprise other nodes, disks, controllers, clusters, etc. Cluster storage construct 202, in some embodiments, can comprise cluster control component 210 that can comprise erasure code component 212, which can comprise variable ratio component 214. In an aspect, cluster control component 210 can enable storing incoming data 220 at disks of a cluster that can be comprised in nodes, e.g., node 204, etc. In an embodiment, the storing of incoming data 220 can be based on one or more erasure code schema, e.g., via erasure code component 212. In an embodiment, context data 221 can be employed to determine a VKMR, e.g., via variable ratio component 214, etc., that can be employed in storing incoming data to the disks of the cluster. Communication framework 230 can facilitate storage of incoming data 220, e.g., according to a determined VKMR for encoded data.

Node controller component 211 can communicate information indicating an erasure code scheme used to store data on the disks, e.g., disk 205, 206, etc. This information can be employed by erasure code component 212 to facilitate encoding of incoming data 220. In an embodiment, data can be encoded according to an indicated erasure coding scheme at erasure code component 212, e.g., where erasure code component 212 is external to node 204, located remotely from node 204, etc. In an embodiment, erasure control component 212 can be comprised in the hardware of, or operate on the hardware of, node 204, e.g., one or more instances of an erasure code component 212 can be associated with one or more nodes of a cluster, etc., such that data can be encoded according to an indicated erasure coding scheme at node 204, etc.

In an aspect, where cluster storage construct 202 at a first time comprises node 204 with disks 205 and 206, incoming data 220 can be written in accord with KMR, e.g., the cluster can be operating in a nominal state. The cluster can then be scaled-up by adding a new disk, e.g., 207, to a node, e.g., node 204, of the cluster. Generally, addition of disk 207 introduces empty storage space that a capacity load balancer component, not illustrated, will try to balance against legacy disks, e.g., disks 205-206, etc., by preferentially writing incoming data to the empty space of disk 207, e.g., a capacity load balancer will attempt to balance the capacity of legacy disks and new disks by writing more often into the new disks. This can result in the new disk being hotter than legacy disks, e.g., from writing the new data to the new disk at a disproportionately high rate in comparison to legacy disk writes, from reading newly written data for replication in a RAIN cluster, from the newly written data typically experiencing a higher proportion of client read events than older data, etc.

Accordingly, where a RAIN is scaled-up by adding disk space to one or more nodes of the RAIN, it can be desirable to limit I/O events to the new disk, e.g., via determining an applying a VKMR to storage of portions of incoming data 220 to the new disk, while still allowing for the new disk to fill faster than legacy disks for the sake of capacity load balance. In an embodiment, context data 221 can comprise an indication of disk 207 being added as a new disk to node 204, e.g., context data can indicate that node 204 of cluster storage construct 202 is being scaled-up. Accordingly, variable ratio component 214 can determine a first VKMR that results in writing all, or almost all, coding fragments to disk 207, while corresponding data fragments are written to legacy disks, e.g., 205, 206, etc. As a result, where coding fragments are typically cooler data than data fragments, the I/O events at disk 207 can be expected to be reduced in comparison to writing with KMR to disk 207.

Context data 221 can be updated, e.g., in real time, near real time, periodically, in response to a trigger/event, etc., such that variable ratio component 214 can update the VKMR applied to storing data in node 204. As an example, where a first VKMR determined in response to adding disk 207 to node 204 results in only coding fragments being written to disk 207, after a time, the first VKMR can be updated to a second VKMR that begins to allow writing of limited numbers of data fragments to disk 207, e.g., warming disk 207 gradually. Over time, the VKMR can be repeatedly updated to control the temperature of disk 207 (and also other disks of node 204). In an embodiment, eventually the amount and ratio of data/coding fragments written to disk 207 can be similar to the amount and ratio of legacy disks 205, 206, etc. At this point, in this example embodiment, VKMR can be the same as KMR and disk 207 can be regarded as a legacy disk. In this example, the use of VKMR began with keeping disk 207 cold, then allowed disk 207 to warm, and eventually to reach similar temperatures of legacy disks 205, 206, etc., which can avoid disk 207 becoming a hot disk that can impact operation of the cluster.

Figure 3:
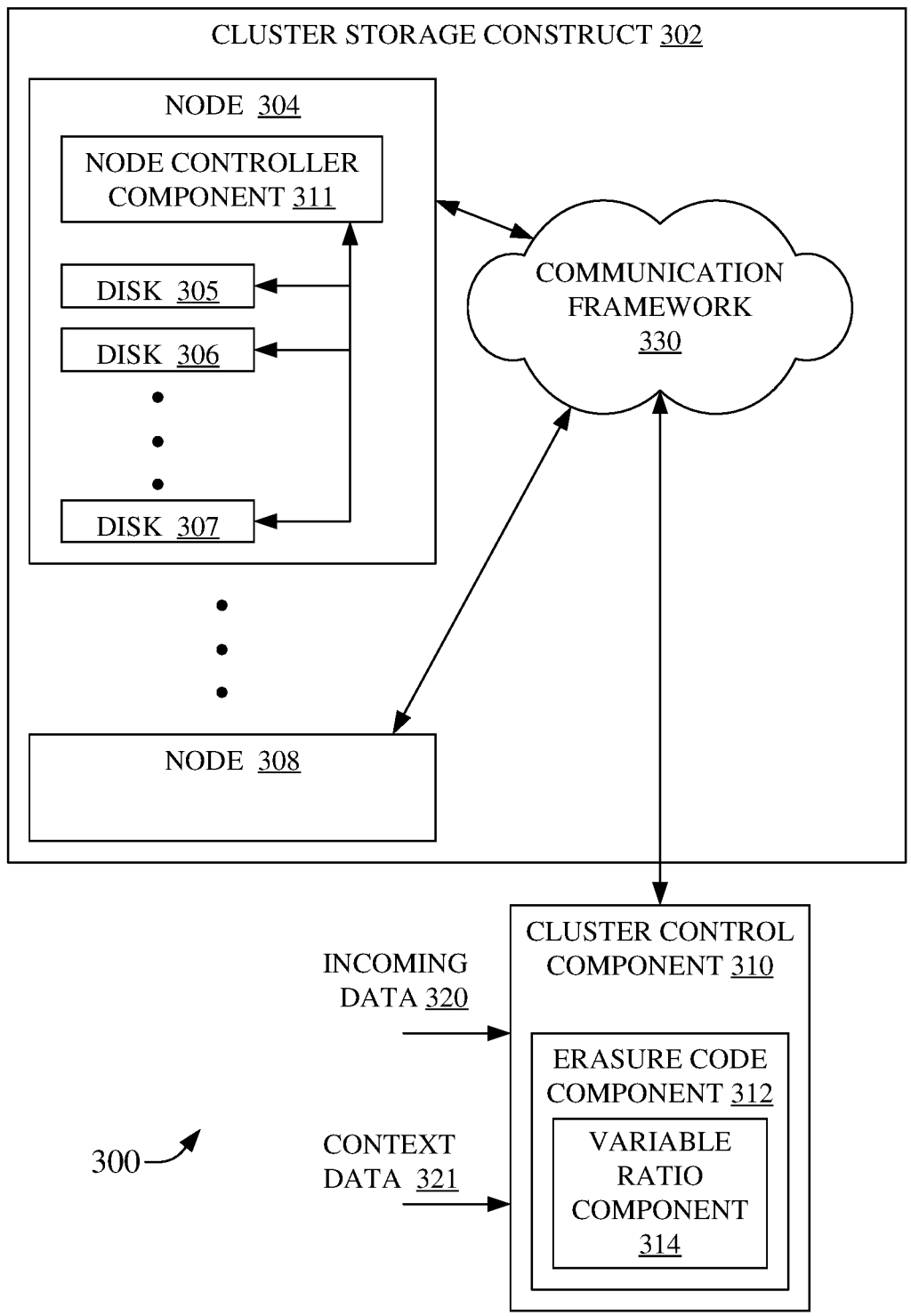
FIG. 3 is an illustration of an example system that can enable adaptive data storing in response to scaling-out a cluster data storage systems employing erasure coding, in accordance with aspects of the subject disclosure.

FIG. 3 is an illustration of a system 300, which can facilitate adaptive data storing in response to scaling-out a cluster data storage systems employing erasure coding, in accordance with aspects of the subject disclosure. System 300 can comprise cluster storage construct 302 that can comprise node 304. Node 304 can comprise node controller component 311 and disks 305-307, etc. In an aspect, system 300 can comprise other nodes, disks, controllers, clusters, etc. Cluster storage construct 302, in some embodiments, can comprise cluster control component 310 that can comprise erasure code component 312, which can comprise variable ratio component 314. In an aspect, cluster control component 310 can enable storing incoming data 320 at disks of a cluster that can be comprised in nodes, e.g., node 304, etc. In an embodiment, the storing of incoming data 320 can be based on one or more erasure code schema, e.g., via erasure code component 312. In an embodiment, context data 321 can be employed to determine a VKMR, e.g., via variable ratio component 314, etc., that can be employed in storing incoming data to the disks of the cluster. Communication framework 330 can facilitate storage of incoming data 320, e.g., according to a determined VKMR for encoded data.

Node controller component 311 can communicate information indicating an erasure code scheme used to store data on the disks, e.g., disk 305, 306, etc. This information can be employed by erasure code component 312 to facilitate encoding of incoming data 320. In an embodiment, data can be encoded according to an indicated erasure coding scheme at erasure code component 312, e.g., where erasure code component 312 is external to node 304, located remotely from node 304, etc. In an embodiment, erasure control component 312 can be comprised in the hardware of, or operate on the hardware of, node 304, e.g., one or more instances of an erasure code component 312 can be associated with one or more nodes of a cluster, etc., such that data can be encoded according to an indicated erasure coding scheme at node 304, etc.

In an aspect, where cluster storage construct 302 at a first time comprises node 304 with disks 305-307, etc., incoming data 320 can be written in accord with KMR, e.g., the cluster can be operating in a nominal state. The cluster can then be scaled-out by adding a new node, e.g., node 308, etc., to the cluster. Generally, addition of node 308 introduces empty storage space, e.g., via disks of the newly added node, that a capacity load balancer component, not illustrated, will try to balance against legacy disks of legacy nodes, e.g., disks 305-307, etc., of node 304, etc., by preferentially writing incoming data to the empty space of disks comprised in node 308, e.g., a capacity load balancer will attempt to balance the capacity of legacy disks and new disks by writing more often into the new disks in the new node resulting from a scaling-out of a cluster. This can result in the new disk being hotter than legacy disks, e.g., from writing the new data to the new disk at a disproportionately high rate in comparison to legacy disk writes, from reading newly written data for replication in a RAIN cluster, from the newly written data typically experiencing a higher proportion of client read events than older data, etc.

Accordingly, where a RAIN is scaled-out by adding one or more nodes to a RAIN, wherein the nodes comprise new storage space, it can be desirable to limit I/O events to the disks of the new node, e.g., via determining an applying a VKMR to storage of portions of incoming data 320 to the disks of node 308, while still allowing for the disks of node 308 to fill faster than legacy disks of node 304, etc., for the sake of capacity load balance. In an embodiment, context data 321 can comprise an indication of node 308 being added as a new disk to the cluster, e.g., context data can indicate that node 308 comprised new storage space and scales-out cluster storage construct 302. Accordingly, variable ratio component 314 can determine a first VKMR that results in writing all, or almost all, coding fragments to disks of node 308, while corresponding data fragments can be written to legacy disks, e.g., 305, 306, etc., of legacy nodes 304, etc. As a result, where coding fragments are typically cooler data than data fragments, the I/O events at disks of node 308 can be expected to be reduced in comparison to writing with KMR to disks of node 308.

Context data 321 can be updated, e.g., in real time, near real time, periodically, in response to a trigger/event, etc., such that variable ratio component 314 can update the VKMR applied to storing data in node 308. As an example, where a first VKMR determined in response to adding node 308 results in only coding fragments being written to disks of node 308, after a time, the first VKMR can be updated to a second VKMR that begins to allow writing of limited numbers of data fragments to disks of node 308, e.g., warming node 308 gradually. Over time, the VKMR can be repeatedly updated to control the temperature of node 308 (and also other nodes 304, etc.) In an embodiment, eventually the amount and ratio of data/coding fragments written to disks of node 308 can be similar to the amount and ratio found on legacy disks 305, 306, etc. At this point, in this example embodiment, VKMR can be the same as KMR and node 308 can be regarded as a legacy node. In this example, the use of VKMR can begin with keeping node 308 cold, then allowing node 308 to warm, and eventually to reach similar temperatures of legacy node 304, etc., which can avoid node 308 becoming a hot node and negatively impacting operation of the cluster.

Figure 4:
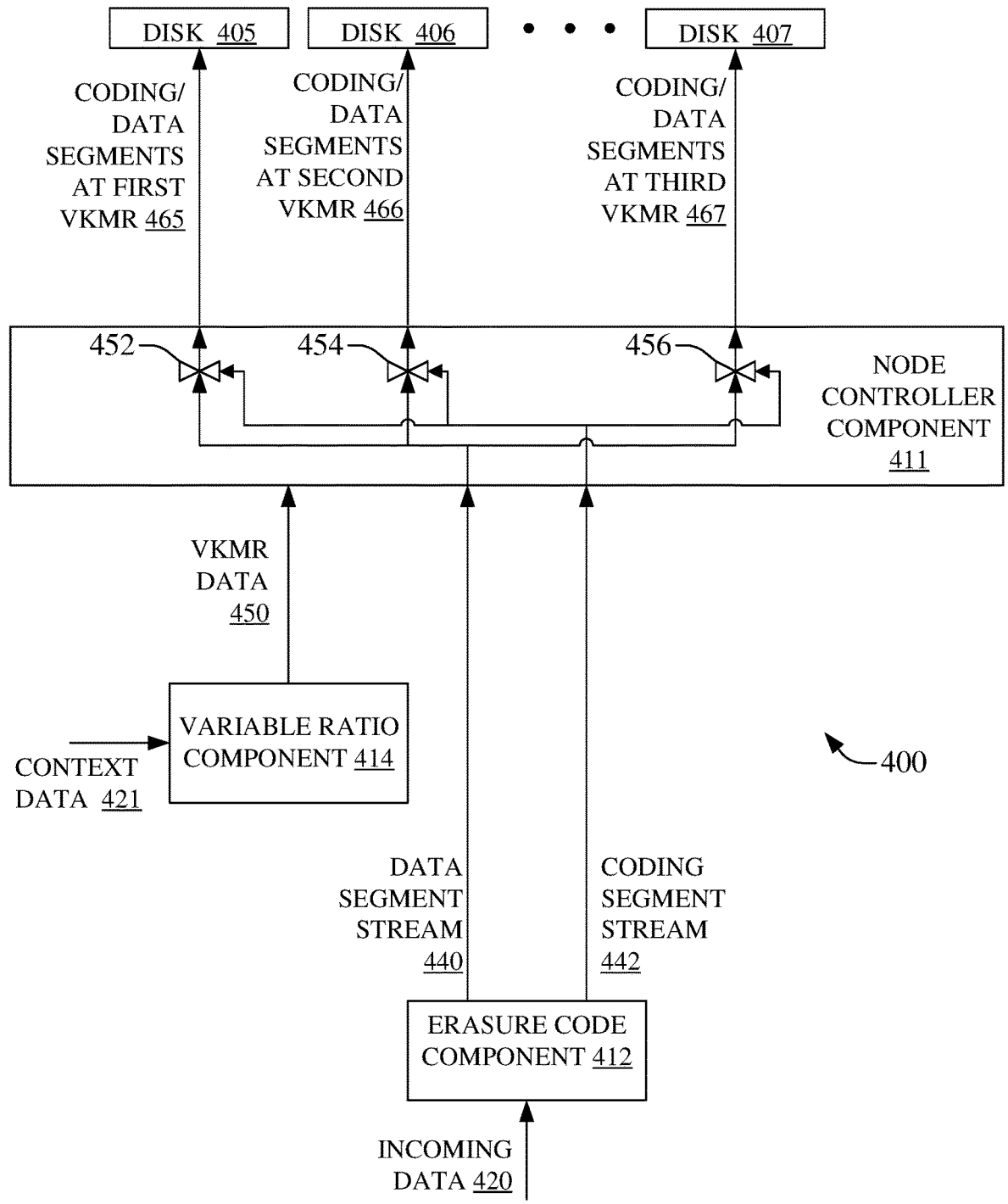
FIG. 4 is an illustration of an example system that can facilitate adaptive data storing based on a variable ratio for a cluster data storage systems employing erasure coding, in accordance with aspects of the subject disclosure.

FIG. 4 is an illustration of a system 400 that can enable adaptive data storing based on a variable ratio for a cluster data storage systems employing erasure coding, in accordance with aspects of the subject disclosure. System 400 can comprise node controller component 411 and disks 405-407, etc. In an aspect, system 400 can comprise other nodes, disks, controllers, clusters, etc. Node controller component 411 can be associated with a node that is comprised in a cluster storage construct, e.g., 102, 202, 302, etc. In some embodiments, node controller component 411 can control and/or orchestrate storage of incoming data 420 to disks of a node, e.g., disks 405-407, etc. In an embodiment, the storing of incoming data 420 can be based on one or more erasure code schema, e.g., via erasure code component 412. In an embodiment, context data 421 can be employed to determine a VKMR, e.g., via variable ratio component 414, etc., that can be employed in storing incoming data to the disks of the cluster, e.g., according to a determined VKMR for encoded data, e.g., data segment stream 440 and coding segment stream 442, etc.

Node controller component 411 can communicate information indicating an erasure code scheme used to store data on the disks, e.g., disk 405, 406, 407, etc. This information can be employed by erasure code component 412 to facilitate encoding of incoming data 420 in to data segment stream 440, coding segment stream 442, etc. In an embodiment, erasure code component 412 can be external to node controller component 411. In some embodiments, erasure code component 412 can be located remotely from node controller component 411. In some embodiments, erasure control component 412 can be comprised in the hardware of, or operate on the hardware of, node controller component 411. Generally, one or more instances of an erasure code component 412 can be associated with one or more nodes of a cluster, etc., such that data can be encoded according to an indicated erasure coding scheme at the node, by the cluster, etc.

In an aspect, node controller component 411 can apply one or more VKMRs to writing encoded portions of incoming data 412 disks of the node, e.g., disks 405-407, etc. Node controller component 411 can comprise mixing valve components, e.g., 452, 454, 456, etc., that can mix data segments and coding segments from data segment stream 440 and coding segment stream 442, according to VKMR data 450, for storage at disks 405-407, etc. As an example, at a first time node, mixing valve component 452 of controller component 411 can write 100% data segments of incoming data 420 to legacy disk 405, e.g., as coding/data segments at first VKMR 465, while mixing valve component 456 of controller component 411 writes 100% code segments of incoming data 420 to new disk 407, e.g., as coding/data segments at third VKMR 467. This can result in new disk 407 being cooler than were incoming data 420 to be written to disk 407 at KMR. Where disk 407 is s new disk added to a node associated with node controller component 411, system 400 can be regarded as a scaling-up of a cluster, e.g., adding disks to a node. However, it will be appreciated that disk 407 can alternatively be a new disk of a new node added to a cluster, e.g., scaling-out of the cluster by adding new storage space via a new node, although that would typically comprise a second instance of node controller component 411. This alternative is considered within the scope of the disclosed subject matter even where not explicitly described for the sake of clarity and brevity. In an aspect, mixing valve component 454 of controller component 411 can also write 100% data segments of incoming data 420 to legacy disk 406, e.g., as coding/data segments at third VKMR 466, which can benefit capacity load balancing while not contributing to heating of new disk 407. In some example embodiments, mixing valve component(s) can writes some mix of coding and data segments of incoming data 420 to disk 405-407.

Whereas context data 421 can be updated, e.g., in real time, near real time, periodically, in response to a trigger/event, etc., variable ratio component 414 can correspondingly update VKMRs applied to storing data via mixing valve components 452-456, etc. Continuing the previous example, disk 407 can be written to in a manner that keeps it as cold as possible while still allowing it to begin being filled for the sake of capacity load balancing, e.g., writing 100% coding segments to disk 407. The VKMRs can then be updated, for example in response to disk 407 reaching a threshold capacity, in response to an elapsed time, in response to an I/O event metric traversing a threshold value, etc. The updated VKMRs can alter the ratio of data to coding fragments being written to disks 405-407, etc. As an example, mixing valve 452, at a second time can employ an updated first VKMR to write to disk 405 with a 2:5 coding-to-data fragment ratio while mixing valve component 456 can employ an updated third VKMR to write to disk 407 with a 7:3 coding-to-data fragment ratio, which can result in slightly warming disk 407 and reducing warming of disk 405. Over time, the VKMRs can be repeatedly updated to control the temperature of disks 405-407, etc. (and also disks of other nodes, for example, via other instances of node controller component 411, etc.) In an embodiment, eventually the amount and ratio of data/coding fragments written to disk 407, etc., can be similar to the amount and ratio found on legacy disks 405, 406, etc. At this point, in this example embodiment, the VKMRs can be adjusted to be the same value as KMR and node 407 can be regarded as a legacy node. In this example, the use of VKMRs can begin with keeping disk 407 as cold as possible, then allowing disk 407 to warm, and eventually to reach similar temperatures of legacy disks 405, 406, etc., which can avoid disk 407 becoming a hot node and negatively impacting operation of the cluster.

Figure 5:
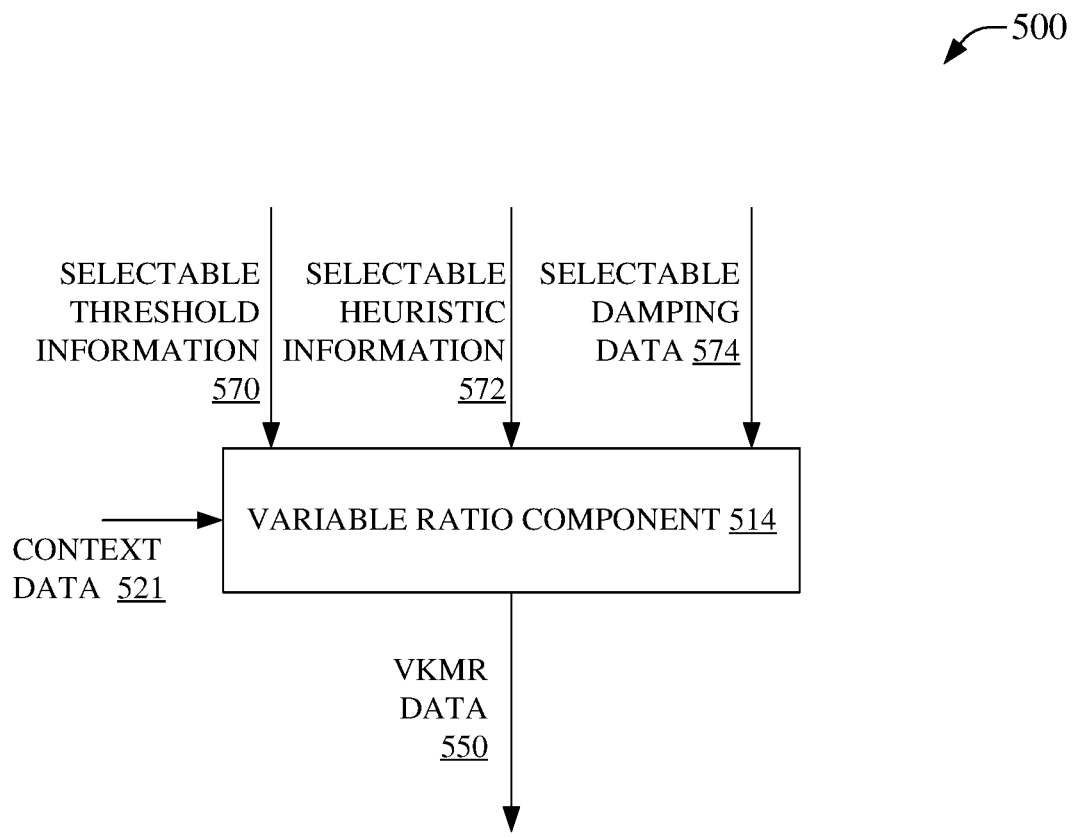
FIG. 5 is an illustration of an example system that can facilitate determining a variable ratio for data storage via a cluster data storage systems employing erasure coding, in accordance with aspects of the subject disclosure.

FIG. 5 is an illustration of a system 500 that can enable determining a variable ratio for data storage via a cluster data storage systems employing erasure coding, in accordance with aspects of the subject disclosure. System 500 can comprise variable ratio component 514 that can generate one or more VKMR(s), e.g., VKMRs can be comprised in VKMR data 550 and can be employed in mixing of coding and data fragments being written to disk(s) of node(s) of cluster(s). Variable ratio component 514 can receive context data 521. Context data 521 can indicate a context(s) of a components of a cluster(s) that are germane to determining a VKMR, e.g., I/O event information, addition of new storage space, e.g., as scaling-up, scaling-out, etc., I/O temperatures of disk(s)/node(s)/cluster(s), etc., so that a VKMR can be determined, selected, etc., to proactively adjust a ratio of coding-to-data fragments being written to disks.

Variable ratio component 514 can, in some embodiments, receive one or more of selectable threshold information 570, selectable heuristic information 572, selectable damping data 574, etc. In an aspect, selectable threshold information 570 can indicate threshold values that can be employed with one or more rules at variable ratio component 514 to determine a VKMR. Threshold values can, for example, relate to new/legacy disk capacities, new/legacy disk utilization, new/legacy disk age, new/legacy disk data access speed, etc. As an example, a threshold value comprised in selectable threshold information 570 can indicate that one or more legacy disks are 90% utilized, which can result, for example, in determining a VKMR that is closer to KMR, e.g., writing both data and coding fragments to a new disk to avoid overutilization of the one or more legacy disks. As a second example, a threshold value comprised in selectable threshold information 570 can indicate that one or more legacy disks are nearing a mean-time-between-failure (MTBF) age, which can result, for example, in determining a VKMR that is again closer to KMR, e.g., writing both data and coding fragments to a new disk to avoid placing excessive amounts of additional data on a legacy disk that could be approaching a failure point. Numerous other examples of selectable threshold values and corresponding rules can be appreciated and are all considered within the scope of the subject disclosure even where not recited for the sake of clarity and brevity.

In an aspect, selectable heuristic information 572 can indicate heuristic information that can be employed with one or more rules at variable ratio component 514 to determine a VKMR. Heuristic information can, for example, relate to conditions in which a VKMR can be adapted. As an example, heuristic information can indicate that a high ratio VKMR is employed until a first condition is met, for example, a new disk I/O component drops below 25% utilization, then a VKMR equal to KMR is to be used until a second condition is met, for example, the I/O component of the new disk rises above a 50% utilization, upon which the high ratio VKMR can be again instituted to prevent the new disk from further heating up.

Selectable damping data 574 can indicate damping data that can be employed with one or more rules at variable ratio component 514 to determine a VKMR. Damping data can, for example, relate to conditions in which a VKMR can be adapted. As an example, an I/O component of a new disk can indicate a sudden increase in I/O events, that without damping, could trigger an adaptation of an employed VKMR. However, with damping, where the sudden increase in I/O events is transient, for example a short but voluminous data access by a client to data of a new disk, an adaptation of the VKMR can be avoided. In an aspect, real time adaptation of a VKMR can be valuable in holding disk temperatures in selected ranges; however, this can also be associated with frequent calculations and alteration of a cluster storage system to employ a VKMR that can change frequently. By applying damping, wild swings in key performance indicators of components of a cluster system can be decoupled from wild swings in VKMRs. As an example, boxcar averaging of I/O events for a new disk can mitigate the prior example spike in client data access and the VKMR can be more gradually adapted or, with enough damping, can remain constant. Selectable damping data 574 can therefore provide an avenue to tune the responsiveness of variable ratio component 514, e.g., allowing selection of how much change, for what duration, etc., KPIs of a cluster are detected before adapting a VKMR. It is noted that overdamping can occur with careless application of selectable damping data 574, which can result in overheated or overcooled disks and can affect performance of a cluster data storage system.

Figure 6:
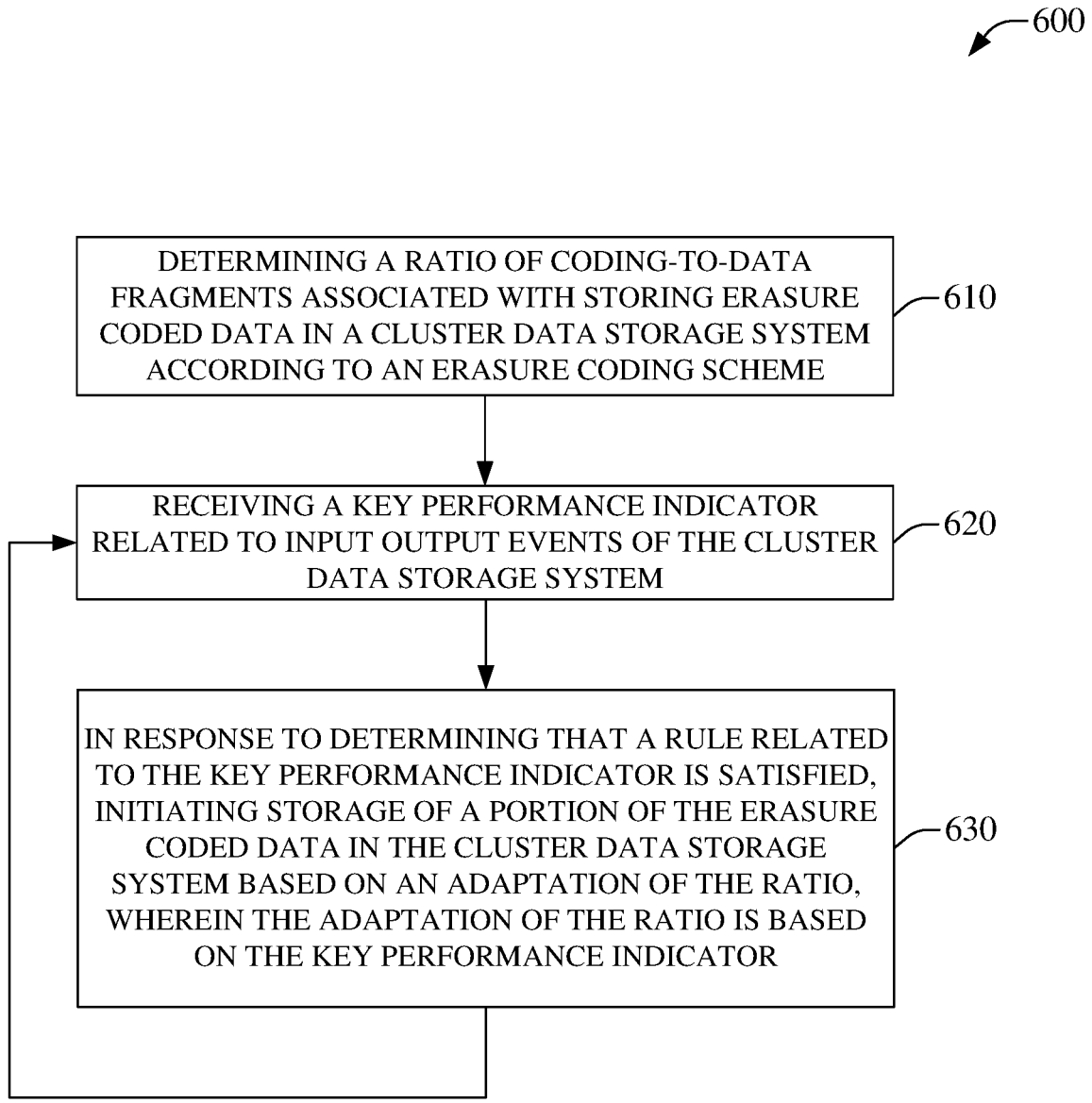
FIG. 6 is an illustration of an example method facilitating adaptive data storing in cluster data storage systems employing erasure coding, in accordance with aspects of the subject disclosure.
Figure 7:
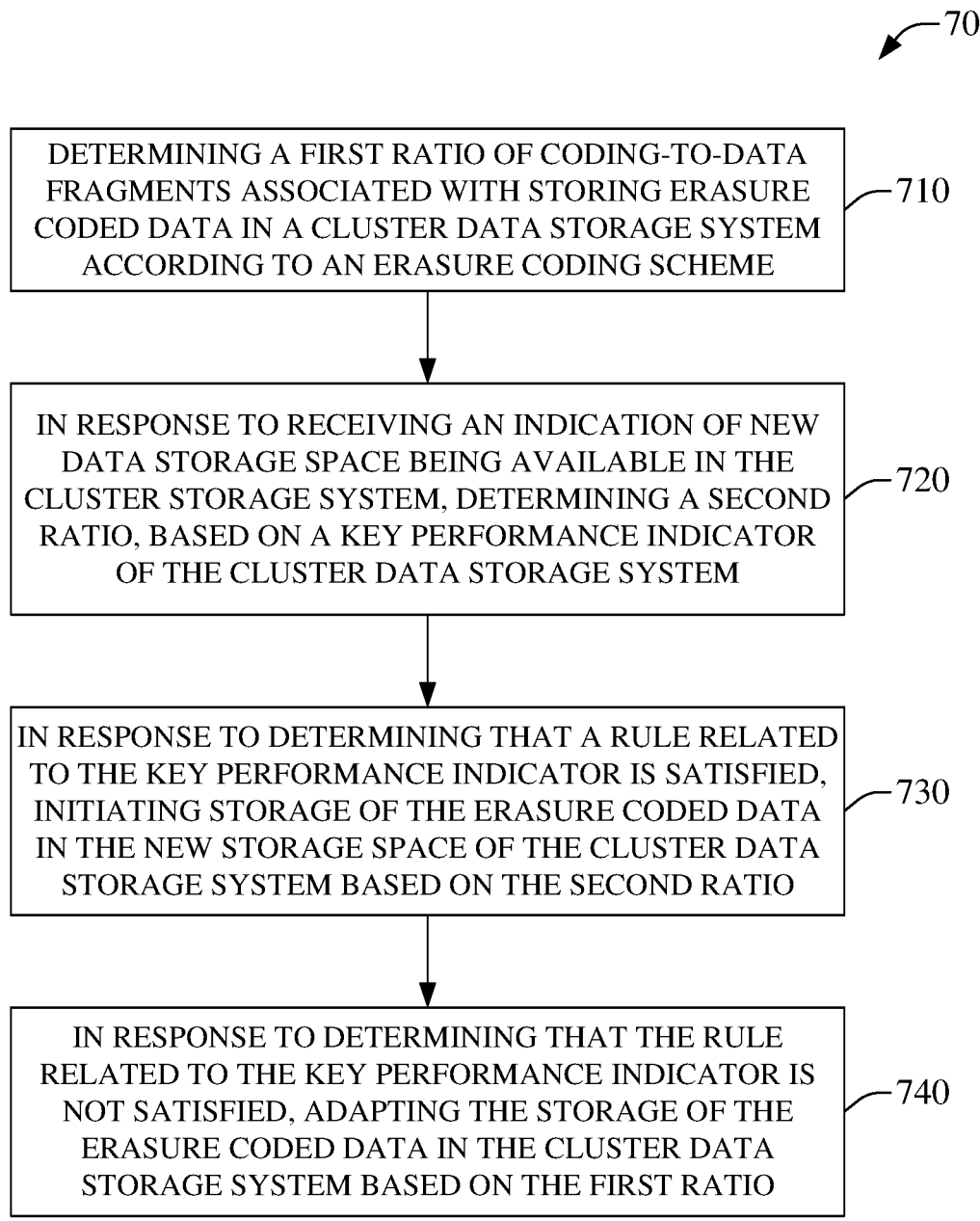
FIG. 7 is an illustration of an example method facilitating adaptive data storing based on a variable ratio for a cluster data storage systems employing erasure coding, in accordance with aspects of the subject disclosure.
Figure 8:
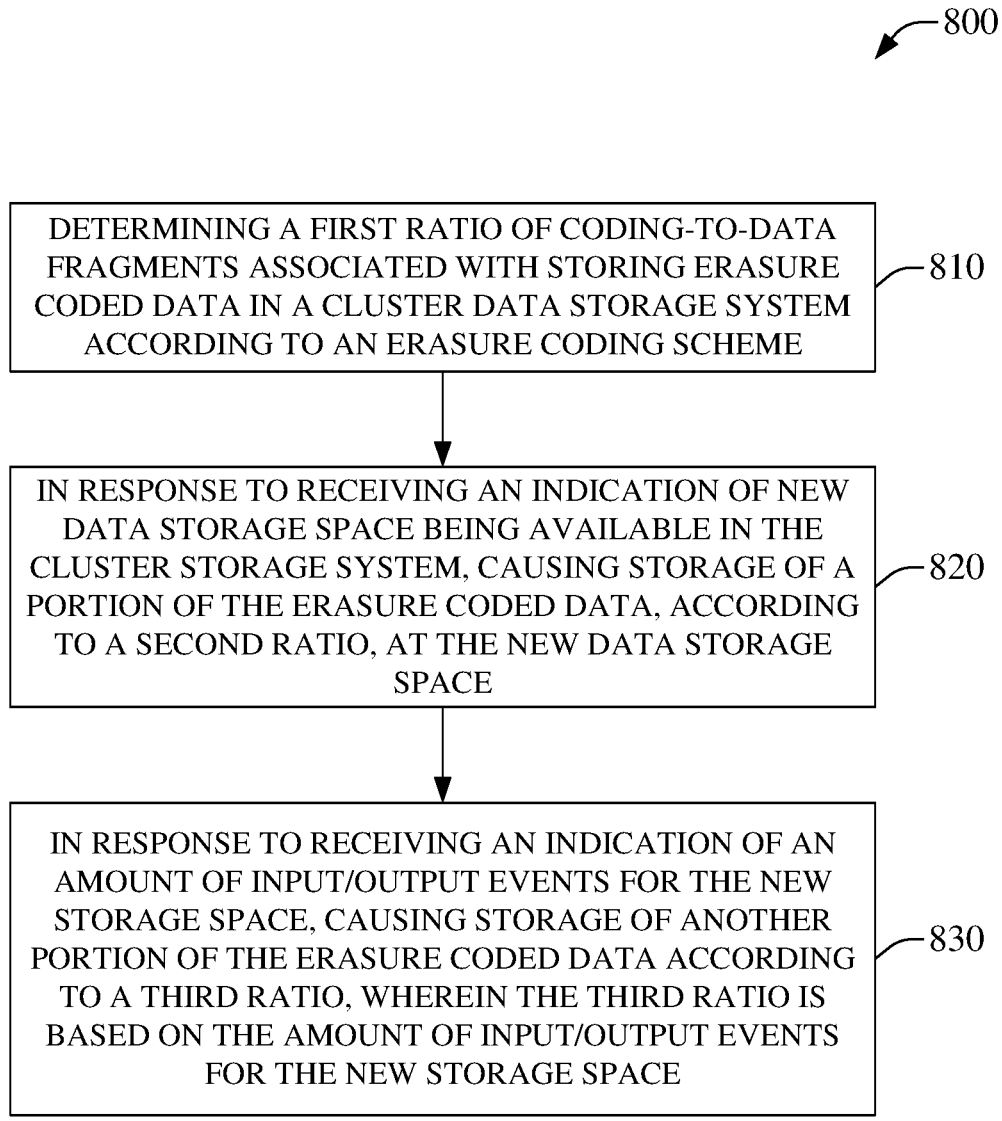
FIG. 8 illustrates an example method enabling determining a variable ratio for data storage via a cluster data storage systems employing erasure coding, in accordance with aspects of the subject disclosure.

In view of the example system(s) described above, example method(s) that can be implemented in accordance with the disclosed subject matter can be better appreciated with reference to flowcharts in FIG. 6-FIG. 8. For purposes of simplicity of explanation, example methods disclosed herein are presented and described as a series of acts; however, it is to be understood and appreciated that the claimed subject matter is not limited by the order of acts, as some acts may occur in different orders and/or concurrently with other acts from that shown and described herein. For example, one or more example methods disclosed herein could alternatively be represented as a series of interrelated states or events, such as in a state diagram. Moreover, interaction diagram(s) may represent methods in accordance with the disclosed subject matter when disparate entities enact disparate portions of the methods. Furthermore, not all illustrated acts may be required to implement a described example method in accordance with the subject specification. Further yet, two or more of the disclosed example methods can be implemented in combination with each other, to accomplish one or more aspects herein described. It should be further appreciated that the example methods disclosed throughout the subject specification are capable of being stored on an article of manufacture (e.g., a computer-readable medium) to allow transporting and transferring such methods to computers for execution, and thus implementation, by a processor or for storage in a memory.

FIG. 6 is an illustration of a method 600 that can enable adaptive data storing in cluster data storage systems employing erasure coding, in accordance with aspects of the subject disclosure. Method 600 can comprise determining a KMR associated with use of an erasure coding scheme to store incoming data in a cluster data storage system. Data can be stored in a cluster according to one or more erasure coding schema to provide protection against data loss, e.g., for a portion of data, such as a data chunk, etc., that can be divided into k data segments, m coding segments can be generated such that up to m segments of the k+m data/coding segments can be lost without compromising access to the data of the data portion, e.g., the data chunk can be resilient to the loss of up to m data/coding segments. A cluster based storage system employing erasure coding can write data to disks in a manner that results in a ratio of data fragments and coding fragments that is uniform across the disks of a node, e.g., a KMR. In an aspect, the KMR can depend on the erasure coding protection scheme being employed. As an example, a 10+2 erasure code scheme can result in a 10:2 ratio of data fragments to coding fragments, e.g., a 10:2 KMR where a disk can have 2 coding fragments for every 10 data fragments. In an aspect, each node that can drive creation of new data within a cluster can independently write data in a manner that keeps the KMR. As such, with a proper capacity load balancing mechanism, a healthy ratio of data and coding fragments at the cluster level can result.

However, use and operation of the cluster can generate key performance indictors (KPIs) that can indicate suboptimal operation of the cluster, for example, data being written to a new disk/node of the cluster can be associated with high levels of I/O events that can be reflected in a KPI. Accordingly, at 620, system 600 can receive a KPI related to I/O events.

At 630, method 600 can determine that the KPI satisfies a rule and can respond by storing a portion of incoming data according to an adapted ratio that is based on the KPI. At this point method 600 can end, however, method 600 can also continue as new or updated KPIs are received. As an example, where a KPI indicates a high level of I/O events, the KMR can be adapted to favor writing of coding segments of the incoming erasure coded data to the disk with the high level of I/O events. This can prevent the disk from getting warmer, as can happen if data were to continue to be written to the disk according to the KMR. This can illustrate a proactive management of writing data to a cluster based on KPIs. In an aspect, the adapted KMR can be a VKMR that can be adjusted in real time or near real time. In an embodiment, when a cluster data storage system is scaled-up, scaled-out, etc., a VKMR can be used to write encoded fragments of incoming data to a disk. The VKMR can be incrementally adjusted based on KPIs, for example on measured I/O events for a new disk, storage space, etc., wherein the incremental adjustment can alter how the disk being written to is used and therefore impacting future corresponding KPIs. An example VKMR can continue to be adjusted until a threshold value is reached. Of note, in this example, where the threshold value is exceeded, then the VKMR can be further adjusted, much like a thermostat can warm a room to a set temperature but then instigate cooling, or at least not keep adding heat, if the target temperature is exceeded. Adjustment of the VKMR can, in some embodiments comprise heuristics that can strive to keep the KPIs, within a selectable value range, etc., e.g., the VKMR can be adapted at a first threshold value and then readapted at a second threshold value that can be different from the first threshold value. Moreover, in these examples, the VKMR can be adapted at different rates. Further, The VKMR can comprise a delay, averaging, etc., that can damp the adjusting of the VKMR to avoid reacting to transient KPI values, for example, a short burst of client data reads may not trigger an adjustment of the VKMR where it is appropriately damped, however, where the client reads continue sufficiently, the VKMR can then be adjusted to proactively cool the disk.

FIG. 7 is an illustration of an example method 700, facilitating adaptive data storing based on a variable ratio for a cluster data storage systems employing erasure coding, in accordance with aspects of the subject disclosure. At 710, method 700 can comprise determining a first KMR associated with use of an erasure coding scheme to store incoming data in a cluster data storage system. A cluster based storage system employing erasure coding can write data to disks in a manner that results in a ratio of data fragments and coding fragments that is uniform across the disks of a node, e.g., a KMR.

At 720, a second ratio can be determined in response to receiving an indication of new storage space being added to the cluster. In an aspect, new space can be added by scaling-up, scaling-out, etc., as disclosed elsewhere herein. The second ratio can be based on a KPI of the cluster data storage system.

At 730, method 700 can, in response to determining that the KPI satisfies a corresponding rule, can initiate storing a portion of incoming data that has been erasure encoded according into the new storage space based on the second ratio. In an embodiment, the second ratio can strongly prefer storing coding fragments at the new disk so as to keep the new disk as cool as possible and, correspondingly, data fragments can be written to legacy disks, etc. In an aspect, where the second ratio highly favors coding fragments at the new storage space, the rule related to the KPI can eventually not be satisfied.

At 740, method 700 can, in response to determining that the rule related to the KPI is not satisfied, can adapt the storage of the erasure coded data in the cluster based on the first ratio. At this point method 700 can end. In an aspect, if the cluster were to continue to strongly favor writing coding fragments to the new storage space, the new storage space would eventually comprise nearly all coding fragments. As is discussed elsewhere herein, this is generally not desirable. As such, at 740, when the method determines that the new storage space has KPIs that result in sustained abnormally high KMR, the method can revert to writing data at KMR to warm the disk, node, etc.

FIG. 8 is an illustration of an example method 800, which can enable determining a variable ratio for data storage via a cluster data storage systems employing erasure coding, in accordance with aspects of the subject disclosure. At 810, method 800 can comprise determining a first KMR associated with use of an erasure coding scheme to store incoming data in a cluster data storage system. A cluster based storage system employing erasure coding can write data to disks in a manner that results in a ratio of data fragments and coding fragments that is uniform across the disks of a node, e.g., a KMR.

At 820, in response to receiving an indication of new storage space becoming available in the cluster, method 800 can cause a portion of the erasure coded data to be stored at the new space according to a second ratio. In an embodiment, the second ratio can strongly prefer storing coding fragments at the new disk so as to keep the new disk as cool as possible and, correspondingly, data fragments can be written to legacy disks, etc. In an aspect, where the second ratio highly favors coding fragments at the new storage space, the rule related to the KPI can eventually not be satisfied.

At 830, method 800 can, in response to receiving an indication of an amount of I/O events for the new storage space, cause storage of another portion of the erasure coded data according to a third ratio. The third ratio can be based on the amount of I/O events for the new storage space. At this point method 800 can end. In an aspect, the storage can begin at 820 with a second ratio that is different to the first ratio, wherein the first ratio can be for the cluster in steady state. The second ratio can be a ratio that keeps s the new storage space as cool as possible. Subsequently a third ratio can be employed based on the effect of the second ratio. As an example, where the second ratio keeps the I/O event count below a threshold level, the third ratio can increase the proportion of data fragments being written in to the new storage space which can result in more I/O events at the new storage space. In some embodiments, 830 can be repeated, which can result in updating the third ratio until it can eventually converge on the first ratio.

Figure 9:
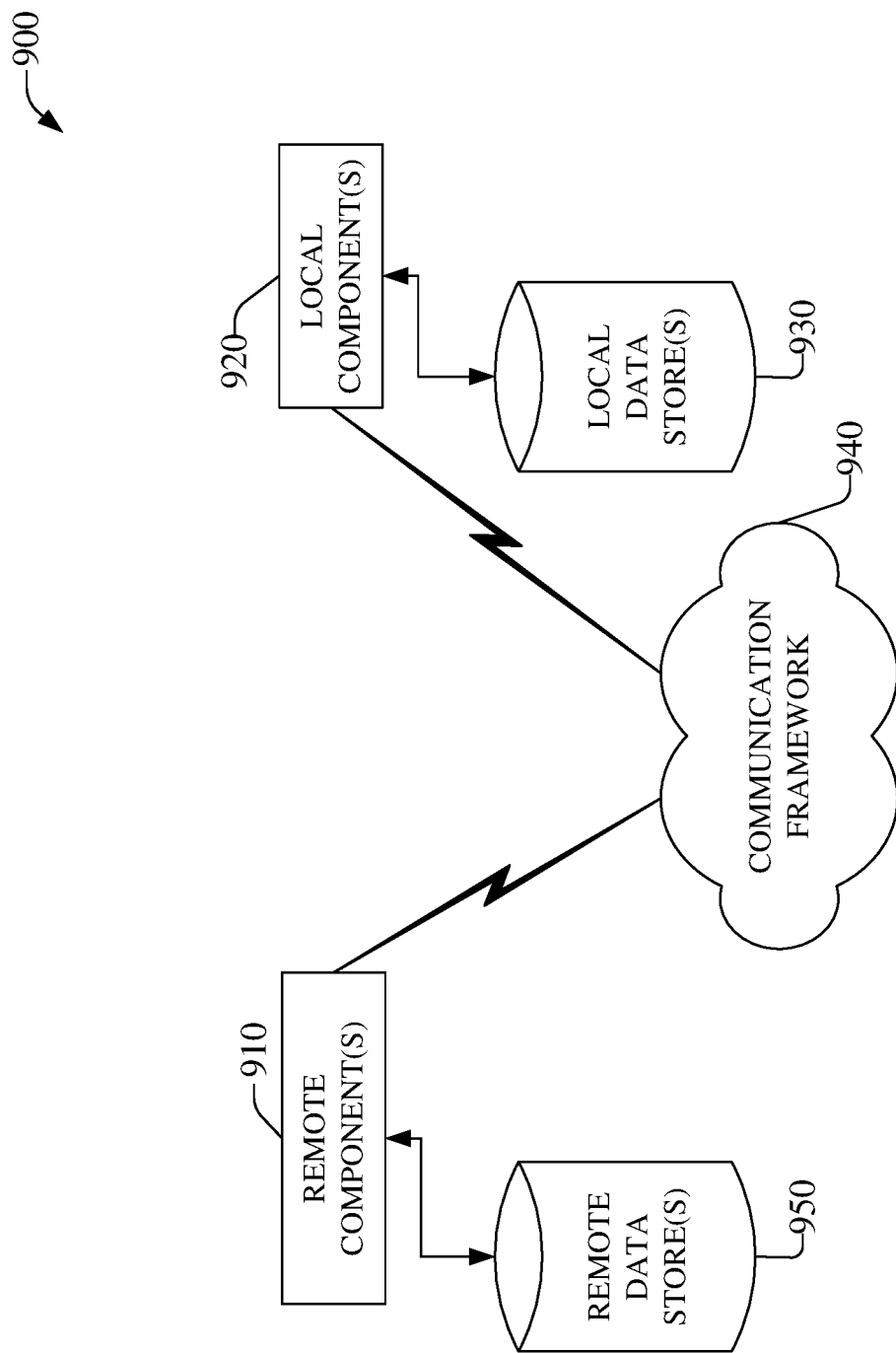
FIG. 9 depicts an example schematic block diagram of a computing environment with which the disclosed subject matter can interact.

FIG. 9 is a schematic block diagram of a computing environment 900 with which the disclosed subject matter can interact. The system 900 comprises one or more remote component(s) 910. The remote component(s) 910 can be hardware and/or software (e.g., threads, processes, computing devices). In some embodiments, remote component(s) 910 can be a remotely located cluster control component, e.g., 110, 210, 310, etc., connected to a local node via a communication framework, e.g., communication framework 230, 330, 940, etc. In some embodiments, remote component(s) 910 can be a first node of cluster storage construct 102, 202, 302, etc., connected to a second node located remotely from the first node and connected via a communication framework, e.g., communication framework 230, 330, 940, etc. Communication framework 940 can comprise wired network devices, wireless network devices, mobile devices, wearable devices, radio access network devices, gateway devices, femtocell devices, servers, etc.

The system 900 also comprises one or more local component(s) 920. The local component(s) 920 can be hardware and/or software (e.g., threads, processes, computing devices). In some embodiments, local component(s) 920 can comprise a local nodes connected to remote nodes via communication framework 940, etc. In an aspect the local nodes can be embodied in cluster storage construct 102, 202, 302, etc.

One possible communication between a remote component(s) 910 and a local component(s) 920 can be in the form of a data packet adapted to be transmitted between two or more computer processes. Another possible communication between a remote component(s) 910 and a local component(s) 920 can be in the form of circuit-switched data adapted to be transmitted between two or more computer processes in radio time slots. The system 900 comprises a communication framework 940 that can be employed to facilitate communications between the remote component(s) 910 and the local component(s) 920, and can comprise an air interface, e.g., Uu interface of a UMTS network, via a long-term evolution (LTE) network, etc. Remote component(s) 910 can be operably connected to one or more remote data store(s) 950, such as a hard drive, solid state drive, SIM card, device memory, etc., that can be employed to store information on the remote component(s) 910 side of communication framework 940. Similarly, local component(s) 920 can be operably connected to one or more local data store(s) 930, that can be employed to store information on the local component(s) 920 side of communication framework 940. As examples, information corresponding to chunks stored on disks of nodes of cluster storage construct 102, 202, 302, etc., can be communicated via communication framework 940 to other disks, nodes, clusters, etc., for example, to facilitate data protection, storing data according to erasure coding, etc., comportment with KPI constraints, etc., as disclosed herein.

In order to provide a context for the various aspects of the disclosed subject matter, FIG. 10, and the following discussion, are intended to provide a brief, general description of a suitable environment in which the various aspects of the disclosed subject matter can be implemented. While the subject matter has been described above in the general context of computer-executable instructions of a computer program that runs on a computer and/or computers, those skilled in the art will recognize that the disclosed subject matter also can be implemented in combination with other program modules. Generally, program modules comprise routines, programs, components, data structures, etc. that performs particular tasks and/or implement particular abstract data types.

In the subject specification, terms such as "store," "storage," "data store," data storage," "database," and substantially any other information storage component relevant to operation and functionality of a component, refer to "memory components," or entities embodied in a "memory" or components comprising the memory. It is noted that the memory components described herein can be either volatile memory or nonvolatile memory, or can comprise both volatile and nonvolatile memory, by way of illustration, and not limitation, volatile memory 1020 (see below), nonvolatile memory 1022 (see below), disk storage 1024 (see below), and memory storage 1046 (see below). Further, nonvolatile memory can be included in read only memory, programmable read only memory, electrically programmable read only memory, electrically erasable read only memory, or flash memory. Volatile memory can comprise random access memory, which acts as external cache memory. By way of illustration and not limitation, random access memory is available in many forms such as synchronous random access memory, dynamic random access memory, synchronous dynamic random access memory, double data rate synchronous dynamic random access memory, enhanced synchronous dynamic random access memory, SynchLink dynamic random access memory, and direct Rambus random access memory. Additionally, the disclosed memory components of systems or methods herein are intended to comprise, without being limited to comprising, these and any other suitable types of memory.

Moreover, it is noted that the disclosed subject matter can be practiced with other computer system configurations, comprising single-processor or multiprocessor computer systems, mini-computing devices, mainframe computers, as well as personal computers, hand-held computing devices (e.g., personal digital assistant, phone, watch, tablet computers, netbook computers, . . . ), microprocessor-based or programmable consumer or industrial electronics, and the like. The illustrated aspects can also be practiced in distributed computing environments where tasks are performed by remote processing devices that are linked through a communications network; however, some if not all aspects of the subject disclosure can be practiced on stand-alone computers. In a distributed computing environment, program modules can be located in both local and remote memory storage devices.

FIG. 10 illustrates a block diagram of a computing system 1000 operable to execute the disclosed systems and methods in accordance with an embodiment. Computer 1012, which can be, for example, comprised in a cluster storage construct 102, 202, 302, etc., cluster control compo 110, 210, 310, etc., node controller component 211, 311, 411, etc., or in other components disclosed herein, can comprise a processing unit 1014, a system memory 1016, and a system bus 1018. System bus 1018 couples system components comprising, but not limited to, system memory 1016 to processing unit 1014. Processing unit 1014 can be any of various available processors. Dual microprocessors and other multiprocessor architectures also can be employed as processing unit 1014.

System bus 1018 can be any of several types of bus structure(s) comprising a memory bus or a memory controller, a peripheral bus or an external bus, and/or a local bus using any variety of available bus architectures comprising, but not limited to, industrial standard architecture, microchannel architecture, extended industrial standard architecture, intelligent drive electronics, video electronics standards association local bus, peripheral component interconnect, card bus, universal serial bus, advanced graphics port, personal computer memory card international association bus, Firewire (Institute of Electrical and Electronics Engineers 1194), and small computer systems interface.

System memory 1016 can comprise volatile memory 1020 and nonvolatile memory 1022. A basic input/output system, containing routines to transfer information between elements within computer 1012, such as during start-up, can be stored in nonvolatile memory 1022. By way of illustration, and not limitation, nonvolatile memory 1022 can comprise read only memory, programmable read only memory, electrically programmable read only memory, electrically erasable read only memory, or flash memory. Volatile memory 1020 comprises read only memory, which acts as external cache memory. By way of illustration and not limitation, read only memory is available in many forms such as synchronous random access memory, dynamic read only memory, synchronous dynamic read only memory, double data rate synchronous dynamic read only memory, enhanced synchronous dynamic read only memory, SynchLink dynamic read only memory, Rambus direct read only memory, direct Rambus dynamic read only memory, and Rambus dynamic read only memory.

Computer 1012 can also comprise removable/non-removable, volatile/non-volatile computer storage media. FIG. 10 illustrates, for example, disk storage 1024. Disk storage 1024 comprises, but is not limited to, devices like a magnetic disk drive, floppy disk drive, tape drive, flash memory card, or memory stick. In addition, disk storage 1024 can comprise storage media separately or in combination with other storage media comprising, but not limited to, an optical disk drive such as a compact disk read only memory device, compact disk recordable drive, compact disk rewritable drive or a digital versatile disk read only memory. To facilitate connection of the disk storage devices 1024 to system bus 1018, a removable or non-removable interface is typically used, such as interface 1026.

Computing devices typically comprise a variety of media, which can comprise computer-readable storage media or communications media, which two terms are used herein differently from one another as follows.

Computer-readable storage media can be any available storage media that can be accessed by the computer and comprises both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can comprise, but are not limited to, read only memory, programmable read only memory, electrically programmable read only memory, electrically erasable read only memory, flash memory or other memory technology, compact disk read only memory, digital versatile disk or other optical disk storage, magnetic cassettes, magnetic tape, magnetic disk storage or other magnetic storage devices, or other tangible media which can be used to store desired information. In this regard, the term "tangible" herein as may be applied to storage, memory or computer-readable media, is to be understood to exclude only propagating intangible signals per se as a modifier and does not relinquish coverage of all standard storage, memory or computer-readable media that are not only propagating intangible signals per se. In an aspect, tangible media can comprise non-transitory media wherein the term "non-transitory" herein as may be applied to storage, memory or computer-readable media, is to be understood to exclude only propagating transitory signals per se as a modifier and does not relinquish coverage of all standard storage, memory or computer-readable media that are not only propagating transitory signals per se. Computer-readable storage media can be accessed by one or more local or remote computing devices, e.g., via access requests, queries or other data retrieval protocols, for a variety of operations with respect to the information stored by the medium. As such, for example, a computer-readable medium can comprise executable instructions stored thereon that, in response to execution, can cause a system comprising a processor to perform operations, comprising selecting a first ratio of coding fragments to data fragments, storing a first portion of encoded data according to the first ratio, determining that a rule relating to a first performance indicator is satisfied, updating the first ratio, resulting in a second ratio, and initiating storage of a second portion of the encoded data according to the second ratio, as is disclosed herein.

Communications media typically embody computer-readable instructions, data structures, program modules or other structured or unstructured data in a data signal such as a modulated data signal, e.g., a carrier wave or other transport mechanism, and comprises any information delivery or transport media. The term "modulated data signal" or signals refers to a signal that has one or more of its characteristics set or changed in such a manner as to encode information in one or more signals. By way of example, and not limitation, communication media comprise wired media, such as a wired network or direct-wired connection, and wireless media such as acoustic, RF, infrared and other wireless media.

It can be noted that FIG. 10 describes software that acts as an intermediary between users and computer resources described in suitable operating environment 1000. Such software comprises an operating system 1028. Operating system 1028, which can be stored on disk storage 1024, acts to control and allocate resources of computer system 1012. System applications 1030 take advantage of the management of resources by operating system 1028 through program modules 1032 and program data 1034 stored either in system memory 1016 or on disk storage 1024. It is to be noted that the disclosed subject matter can be implemented with various operating systems or combinations of operating systems.

A user can enter commands or information into computer 1012 through input device(s) 1036. In some embodiments, a user interface can allow entry of user preference information, etc., and can be embodied in a touch sensitive display panel, a mouse/pointer input to a graphical user interface (GUI), a command line controlled interface, etc., allowing a user to interact with computer 1012. Input devices 1036 comprise, but are not limited to, a pointing device such as a mouse, trackball, stylus, touch pad, keyboard, microphone, joystick, game pad, satellite dish, scanner, TV tuner card, digital camera, digital video camera, web camera, cell phone, smartphone, tablet computer, etc. These and other input devices connect to processing unit 1014 through system bus 1018 by way of interface port(s) 1038. Interface port(s) 1038 comprise, for example, a serial port, a parallel port, a game port, a universal serial bus, an infrared port, a Bluetooth port, an IP port, or a logical port associated with a wireless service, etc. Output device(s) 1040 use some of the same type of ports as input device(s) 1036.

Thus, for example, a universal serial busport can be used to provide input to computer 1012 and to output information from computer 1012 to an output device 1040. Output adapter 1042 is provided to illustrate that there are some output devices 1040 like monitors, speakers, and printers, among other output devices 1040, which use special adapters. Output adapters 1042 comprise, by way of illustration and not limitation, video and sound cards that provide means of connection between output device 1040 and system bus 1018. It should be noted that other devices and/or systems of devices provide both input and output capabilities such as remote computer(s) 1044.

Computer 1012 can operate in a networked environment using logical connections to one or more remote computers, such as remote computer(s) 1044. Remote computer(s) 1044 can be a personal computer, a server, a router, a network PC, cloud storage, a cloud service, code executing in a cloud-computing environment, a workstation, a microprocessor-based appliance, a peer device, or other common network node and the like, and typically comprises many or all of the elements described relative to computer 1012. A cloud computing environment, the cloud, or other similar terms can refer to computing that can share processing resources and data to one or more computer and/or other device(s) on an as needed basis to enable access to a shared pool of configurable computing resources that can be provisioned and released readily. Cloud computing and storage solutions can store and/or process data in third-party data centers which can leverage an economy of scale and can view accessing computing resources via a cloud service in a manner similar to a subscribing to an electric utility to access electrical energy, a telephone utility to access telephonic services, etc.

For purposes of brevity, only a memory storage device 1046 is illustrated with remote computer(s) 1044. Remote computer(s) 1044 is logically connected to computer 1012 through a network interface 1048 and then physically connected by way of communication connection 1050. Network interface 1048 encompasses wire and/or wireless communication networks such as local area networks and wide area networks. Local area network technologies comprise fiber distributed data interface, copper distributed data interface, Ethernet, Token Ring and the like. Wide area network technologies comprise, but are not limited to, point-to-point links, circuit-switching networks like integrated services digital networks and variations thereon, packet switching networks, and digital subscriber lines. As noted below, wireless technologies may be used in addition to or in place of the foregoing.

Communication connection(s) 1050 refer(s) to hardware/software employed to connect network interface 1048 to bus 1018. While communication connection 1050 is shown for illustrative clarity inside computer 1012, it can also be external to computer 1012. The hardware/software for connection to network interface 1048 can comprise, for example, internal and external technologies such as modems, comprising regular telephone grade modems, cable modems and digital subscriber line modems, integrated services digital network adapters, and Ethernet cards.

The above description of illustrated embodiments of the subject disclosure, comprising what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

As it employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit, a digital signal processor, a field programmable gate array, a programmable logic controller, a complex programmable logic device, a discrete gate or transistor logic, discrete hardware components, or any combination thereof designed to perform the functions described herein. Processors can exploit nano-scale architectures such as, but not limited to, molecular and quantum-dot based transistors, switches and gates, in order to optimize space usage or enhance performance of user equipment. A processor may also be implemented as a combination of computing processing units.

As used in this application, the terms "component," "system," "platform," "layer," "selector," "interface," and the like are intended to refer to a computer-related entity or an entity related to an operational apparatus with one or more specific functionalities, wherein the entity can be either hardware, a combination of hardware and software, software, or software in execution. As an example, a component may be, but is not limited to being, a process running on a processor, a processor, an object, an executable, a thread of execution, a program, and/or a computer. By way of illustration and not limitation, both an application running on a server and the server can be a component. One or more components may reside within a process and/or thread of execution and a component may be localized on one computer and/or distributed between two or more computers. In addition, these components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or a firmware application executed by a processor, wherein the processor can be internal or external to the apparatus and executes at least a part of the software or firmware application. As yet another example, a component can be an apparatus that provides specific functionality through electronic components without mechanical parts, the electronic components can comprise a processor therein to execute software or firmware that confers at least in part the functionality of the electronic components.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. Moreover, the use of any particular embodiment or example in the present disclosure should not be treated as exclusive of any other particular embodiment or example, unless expressly indicated as such, e.g., a first embodiment that has aspect A and a second embodiment that has aspect B does not preclude a third embodiment that has aspect A and aspect B. The use of granular examples and embodiments is intended to simplify understanding of certain features, aspects, etc., of the disclosed subject matter and is not intended to limit the disclosure to said granular instances of the disclosed subject matter or to illustrate that combinations of embodiments of the disclosed subject matter were not contemplated at the time of actual or constructive reduction to practice.

Further, the term "include" is intended to be employed as an open or inclusive term, rather than a closed or exclusive term. The term "include" can be substituted with the term "comprising" and is to be treated with similar scope, unless otherwise explicitly used otherwise. As an example, "a basket of fruit including an apple" is to be treated with the same breadth of scope as, "a basket of fruit comprising an apple."

Furthermore, the terms "user," "subscriber," "customer," "consumer," "prosumer," "agent," and the like are employed interchangeably throughout the subject specification, unless context warrants particular distinction(s) among the terms. It should be appreciated that such terms can refer to human entities, machine learning components, or automated components (e.g., supported through artificial intelligence, as through a capacity to make inferences based on complex mathematical formalisms), that can provide simulated vision, sound recognition and so forth.

Aspects, features, or advantages of the subject matter can be exploited in substantially any, or any, wired, broadcast, wireless telecommunication, radio technology or network, or combinations thereof. Non-limiting examples of such technologies or networks comprise broadcast technologies (e.g., sub-Hertz, extremely low frequency, very low frequency, low frequency, medium frequency, high frequency, very high frequency, ultra-high frequency, super-high frequency, extremely high frequency, terahertz broadcasts, etc.); Ethernet; X.25; powerline-type networking, e.g., Powerline audio video Ethernet, etc.; femtocell technology; Wi-Fi; worldwide interoperability for microwave access; enhanced general packet radio service; second generation partnership project (2G or 2GPP); third generation partnership project (3G or 3GPP); fourth generation partnership project (4G or 4GPP); long term evolution (LTE); fifth generation partnership project (5G or 5GPP); third generation partnership project universal mobile telecommunications system; third generation partnership project 2; ultra mobile broadband; high speed packet access; high speed downlink packet access; high speed uplink packet access; enhanced data rates for global system for mobile communication evolution radio access network; universal mobile telecommunications system terrestrial radio access network; or long term evolution advanced. As an example, a millimeter wave broadcast technology can employ electromagnetic waves in the frequency spectrum from about 30 GHz to about 300 GHz. These millimeter waves can be generally situated between microwaves (from about 1 GHz to about 30 GHz) and infrared (IR) waves, and are sometimes referred to extremely high frequency (EHF). The wavelength (k) for millimeter waves is typically in the 1-mm to 10-mm range.

The term "infer" or "inference" can generally refer to the process of reasoning about, or inferring states of, the system, environment, user, and/or intent from a set of observations as captured via events and/or data. Captured data and events can include user data, device data, environment data, data from sensors, sensor data, application data, implicit data, explicit data, etc. Inference, for example, can be employed to identify a specific context or action, or can generate a probability distribution over states of interest based on a consideration of data and events. Inference can also refer to techniques employed for composing higher-level events from a set of events and/or data. Such inference results in the construction of new events or actions from a set of observed events and/or stored event data, whether the events, in some instances, can be correlated in close temporal proximity, and whether the events and data come from one or several event and data sources. Various classification schemes and/or systems (e.g., support vector machines, neural networks, expert systems, Bayesian belief networks, fuzzy logic, and data fusion engines) can be employed in connection with performing automatic and/or inferred action in connection with the disclosed subject matter.

What has been described above includes examples of systems and methods illustrative of the disclosed subject matter. It is, of course, not possible to describe every combination of components or methods herein. One of ordinary skill in the art may recognize that many further combinations and permutations of the claimed subject matter are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

What is claimed is:

1. A system, comprising:
a processor; and
a memory that stores executable instructions that, when executed by the processor, facilitate performance of operations, comprising:
in response to receiving incoming data, generating encoded data based on the incoming data according to an erasure code scheme, wherein the encoded data comprises k coding fragments of the encoded data for every m data fragments of the encoded data, wherein k is a positive integer, and wherein m is a positive integer;
causing storage of a first portion of the encoded data according to a first ratio of coding fragments to data fragments;

determining a first performance indicator value corresponding to the storage of the first portion of encoded data according to the first ratio;

in response to determining that a rule relating to the first performance indicator is satisfied, updating the first ratio, resulting in a second ratio; and causing storage of a second portion of the encoded data according to the second ratio.

2. The system of claim 1, wherein the first ratio of coding fragments to data fragments is different than k coding fragments to m data fragments.

3. The system of claim 2, wherein the first ratio of coding fragments to data fragments is greater than k coding fragments to m data fragments.

4. The system of claim 1, wherein the first performance indicator value indicates a count of input/output events of a storage device storing the first portion of the encoded data.

5. The system of claim 4, wherein the rule relating to the first performance indicator is satisfied if the count of input/output events is below a selectable threshold value.

6. The system of claim 5, wherein the selectable threshold value is selected from a group of threshold values comprising an average count of input/output events for other storage devices of the storage system, and a median count of input/output events for other storage devices of the storage system.

7. The system of claim 1, wherein the second ratio of coding fragments to data fragments is lower than the first ratio of coding fragments to data fragments.

8. The system of claim 7, wherein the second ratio is k coding fragments to m data fragments.

9. The system of claim 7, wherein the second ratio is lower than k coding fragments to m data fragments.

10. A method, comprising:

selecting, by a system comprising a processor and a memory, a first ratio of coding fragments to data fragments, wherein the coding fragments and the data fragments are comprised in encoded data for storage in a storage system, wherein the encoded data is a representation of incoming data according to an erasure code scheme, wherein the encoded data comprises k coding fragments of the encoded data for every m data fragments of the encoded data, wherein k is a positive integer, and wherein m is a positive integer;

initiating, by the system, storage of a first portion of the encoded data according to the first ratio;

determining, by the system, a first performance indicator value corresponding to the storage of the first portion of encoded data according to the first ratio;

in response to determining that a rule relating to the first performance indicator is satisfied, updating, by the system, the first ratio, resulting in a second ratio that is different than the first ratio; and initiating, by the system, storage of a second portion of the encoded data according to the second ratio.

11. The method of claim 10, wherein the initiating the storage of a first portion of the encoded data is according to a ratio of coding fragments to data fragments that is greater than k coding fragments to m data fragments.

12. The method of claim 10, wherein the determining that the rule relating to the first performance indicator is satisfied is based on a volume of input/output events, per unit time, of a storage device storing the first portion, and a selectable threshold value.

13. The method of claim 10, wherein the updating the first ratio resulting in the second ratio of coding fragments to data fragments results in the second ratio being lower than the first ratio.

14. The method of claim 10, wherein the updating the first ratio resulting in the second ratio of coding fragments to data fragments results in the second ratio being k coding fragments to m data fragments.

15. The method of claim 10, wherein the updating the first ratio resulting in the second ratio of coding fragments to data fragments results in the second ratio being lower than k coding fragments to m data fragments.

16. A non-transitory machine-readable storage medium, comprising executable instructions that, when executed by a processor, facilitate performance of operations, comprising:

determining a first ratio of coding fragments to data fragments based on a first performance indicator of a storage system, wherein the coding fragments and the data fragments are comprised in encoded data to be stored in the storage system, wherein the encoded data is a representation of incoming data according to an erasure code scheme, and wherein the encoded data comprises k coding fragments of the encoded data for every m data fragments of the encoded data, wherein k is a positive integer, and wherein m is a positive integer;

storing a first portion of a first protection set of the encoded data according to the first ratio at a first storage device of the storage system, and storing a second portion of the first protection set of the encoded data at a second storage device of the storage system;

determining a first performance indicator value corresponding to the storage of the first portion of encoded data according to the first ratio;

in response to determining that a rule relating to the first performance indicator is satisfied, updating the first ratio, resulting in a second ratio that is different than the first ratio; and storing a third portion of a second protection set of the encoded data according to the second ratio at the first storage device, and storing a fourth portion of the second protection set of the encoded data at a third storage device of the storage system.

17. The non-transitory machine-readable storage medium of claim 16, wherein the first ratio of coding fragments to data fragments is greater than k coding fragments to m data fragments.

18. The non-transitory machine-readable storage medium of claim 16, wherein the second ratio of coding fragments to data fragments is lower than the first ratio of coding fragments to data fragments.

19. The non-transitory machine-readable storage medium of claim 18, wherein the second ratio is k coding fragments to m data fragments.

20. The non-transitory machine-readable storage medium of claim 18, wherein the second ratio is lower than k coding fragments to m data fragments.

* * * * *